US010659713B2

(12) United States Patent
Shikina

(10) Patent No.: US 10,659,713 B2
(45) Date of Patent: May 19, 2020

(54) IMAGE SENSING DEVICE

(71) Applicant: CANON KABUSHIKI KAISHA, Tokyo (JP)

(72) Inventor: Noriyuki Shikina, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 16/118,906

(22) Filed: Aug. 31, 2018

(65) Prior Publication Data

US 2019/0082133 A1 Mar. 14, 2019

(30) Foreign Application Priority Data

Sep. 11, 2017 (JP) .................................. 2017-174245

(51) Int. Cl.
| | |
|---|---|
| *H04N 5/378* | (2011.01) |
| *H04N 5/347* | (2011.01) |
| *H04N 5/363* | (2011.01) |
| *H04N 5/369* | (2011.01) |
| *H04N 5/374* | (2011.01) |
| *H01L 27/146* | (2006.01) |
| *H04N 5/3745* | (2011.01) |

(52) U.S. Cl.
CPC ............. *H04N 5/378* (2013.01); *H04N 5/347* (2013.01); *H04N 5/363* (2013.01); *H04N 5/36961* (2018.08); *H04N 5/3741* (2013.01); *H04N 5/3745* (2013.01); *H01L 27/14627* (2013.01); *H01L 27/14641* (2013.01); *H01L 27/14643* (2013.01)

(58) Field of Classification Search
CPC .... H04N 5/378; H04N 5/347; H04N 5/36961; H04N 5/363; H04N 5/3741; H04N 5/3745; H01L 27/14627; H01L 27/14643; H01L 27/14641

USPC ....... 348/308, 294, 300, 301, 302, 312, 319, 348/321, 323, 676, 241, 326, 345, 353, 348/230.1, 572; 250/208.1; 257/291, 257/292; 341/108, 110

See application file for complete search history.

(56) References Cited

U.S. PATENT DOCUMENTS 9,948,879 B2 *   8/2018  Hirai ...................... H04N 5/378
                                                                  348/297
2009/0046186 A1 * 2/2009  Nagai .................... H04N 5/335
                                                                  348/301

(Continued)

FOREIGN PATENT DOCUMENTS

JP    2015-177429 A    10/2015

Primary Examiner — Marly S Camargo
(74) Attorney, Agent, or Firm — Venable LLP

(57) ABSTRACT

An image sensing device includes a pixel array having a plurality of pixels each including first and second photoelectric converters that share a microlens, a plurality of column signal lines, and a readout circuit including a plurality of column circuits each configured to receive a signal of a corresponding column signal line. Each pixel includes first and second driving elements respectively configured to output signals corresponding to charges respectively generated by the first and second photoelectric converters to a corresponding column signal line. In a state in which signals are output from both the first and second driving elements included in a selected pixel to a column signal line corresponding to each of the plurality of column circuits, the readout circuit reads out a signal of the column signal line corresponding to the column circuit.

14 Claims, 15 Drawing Sheets

(56) References Cited

U.S. PATENT DOCUMENTS

| | | | |
|---|---|---|---|
| 2012/0026370 A1* | 2/2012 | Oike | H04N 5/2173 |
| | | | 348/298 |
| 2016/0043119 A1* | 2/2016 | Lee | H01L 24/146 |
| | | | 250/208.1 |
| 2016/0073016 A1 | 3/2016 | Ohya et al. | |
| 2016/0141326 A1 | 5/2016 | Hanzawa | |
| 2016/0241772 A1* | 8/2016 | Johnson | H04N 5/23212 |
| | | | 348/345 |
| 2017/0155863 A1* | 6/2017 | Shikina | H04N 5/378 |
| | | | 348/301 |
| 2018/0007287 A1* | 1/2018 | Takenaka | H04N 5/30 |
| | | | 348/294 |
| 2018/0241959 A1 | 8/2018 | Taniguchi et al. | |
| 2018/0249106 A1* | 8/2018 | Mu | H04N 5/3696 |
| | | | 348/349 |
| 2019/0068910 A1* | 2/2019 | Taniguchi | H04N 5/37455 |
| | | | 348/308 |

* cited by examiner ized image sensing device. The image sensing device 1 can be formed as, for example, a CMOS image sensor. Alternatively, the image sensing device 1 can be formed as a camera that includes the CMOS image sensor. The concept of the camera also includes an information processing terminal or the like having an image sensing function.

IMAGE SENSING DEVICE

BACKGROUND OF THE INVENTION

Field of the Invention

The present invention relates to an image sensing device.

Description of the Related Art

Japanese Patent Laid-Open No. 2015-177429 describes a solid-state image sensing device capable of detecting a phase difference and generating an image. In the solid-state image sensing device, each pixel includes the first photoelectric converter and the second photoelectric converter that photoelectrically convert light entered via one microlens. Charges generated by the first photoelectric converter are read out by the first readout circuit. Charges generated by the second photoelectric converter are read out by the second readout circuit. The solid-state image sensing device includes a transistor that connects the first charge holder of the first readout circuit and the second charge holder included in the second readout circuit. The transistor connects the first charge holder and the second charge holder when a pixel is used as an image generation pixel, and separates the first charge holder and the second charge holder from each other when the pixel is used as a focus detection pixel.

In the solid-state image sensing device disclosed in Japanese Patent Laid-Open No. 2015-177429, the transistor connects the first charge holder of the first readout circuit and the second charge holder of the second readout circuit in order to generate an image. Such an arrangement increases the number of transistors.

SUMMARY OF THE INVENTION

The present invention provides a technique advantageous in simplifying an arrangement for reading out a signal that forms an image in an image sensing device in which two photoelectric converters share one microlens.

One of the aspects of the present invention provides an image sensing device comprising: a pixel array in which a plurality of pixels are arranged in a matrix, and each pixel includes first and second photoelectric converters that share a microlens; a plurality of column signal lines each connected to pixels arranged in a corresponding column out of the plurality of pixels; and a readout circuit including a plurality of column circuits each configured to receive a signal of a corresponding column signal line out of the plurality of column signal lines, wherein each of the plurality of pixels includes first and second driving elements respectively configured to output signals corresponding to charges respectively generated by the first and second photoelectric converters to a corresponding column signal line out of the plurality of column signal lines, and in a state in which signals are output from both the first and second driving elements included in a selected pixel to a column signal line corresponding to each of the plurality of column circuits, the readout circuit reads out a signal of the column signal line corresponding to the column circuit.

Further features of the present invention will become apparent from the following description of exemplary embodiments with reference to the attached drawings.

DESCRIPTION OF THE EMBODIMENTS

The present invention will now be described with reference to the accompanying drawings by way of embodiments.

Figure 1:
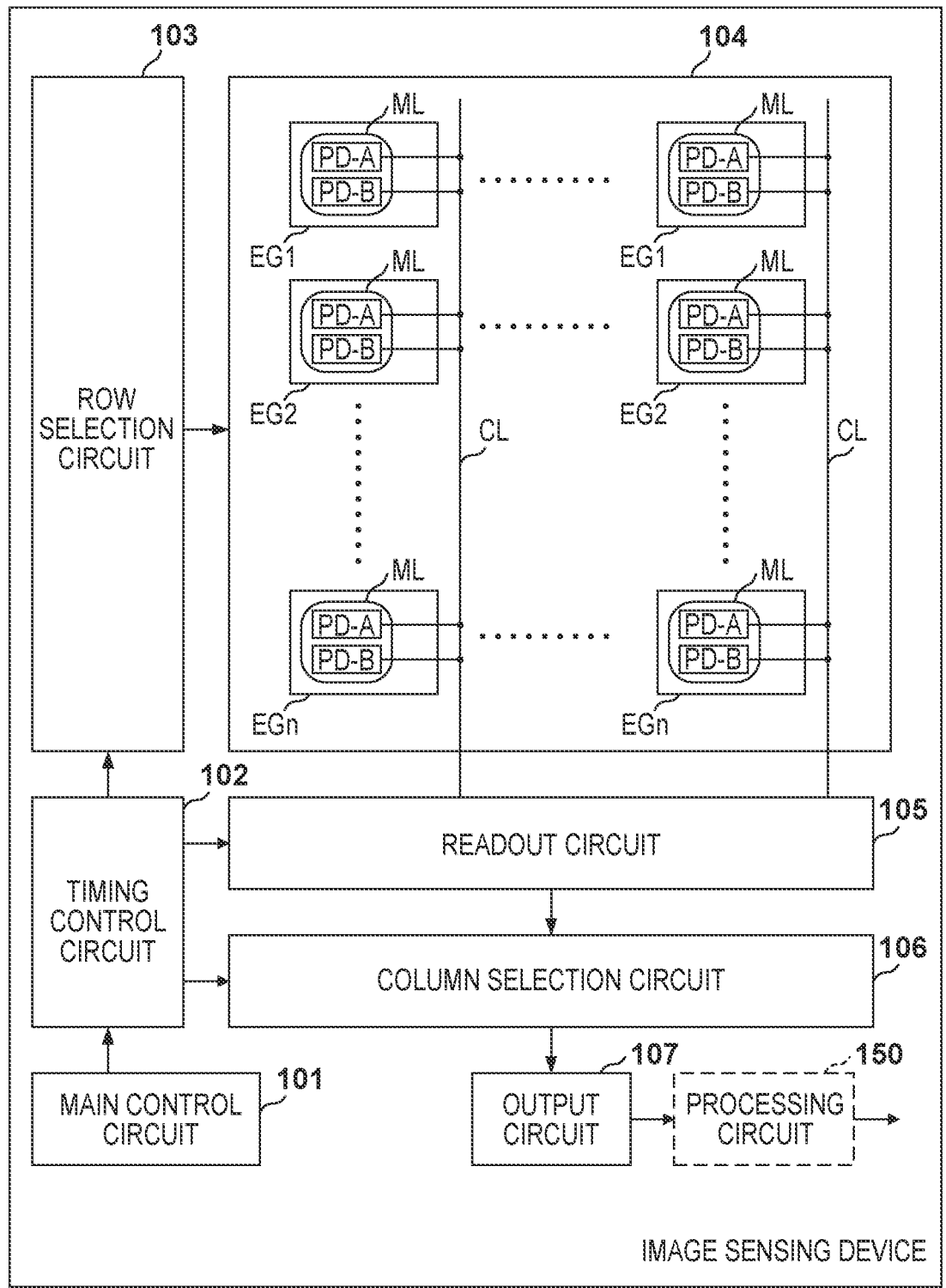
FIG. 1 is a block diagram showing the arrangement of an image sensing device according to the first embodiment.

FIG. 1 is a block diagram showing the arrangement of an image sensing device 1 according to the first embodiment of the present invention. The image sensing device 1 can be formed as, for example, a CMOS image sensor. Alternatively, the image sensing device 1 can be formed as a camera that includes the CMOS image sensor. The concept of the camera also includes an information processing terminal or the like having an image sensing function.

The image sensing device 1 can include a main control circuit 101, a timing control circuit 102, a row selection circuit 103, a pixel array 104, a readout circuit 105, a column selection circuit 106, and an output circuit 107. The main control circuit 101 controls the timing control circuit 102. The timing control circuit 102 controls the row selection circuit 103, the readout circuit 105, the column selection circuit 106, and the output circuit 107.

The pixel array 104 is formed by arranging a plurality of pixels EG in a matrix. Each pixel EG includes first and second photoelectric converters PD-A and PD-B that share a microlens ML. Each of a plurality of column signal lines CL is shared by the predetermined number of pixels EG. Each of the plurality of column signal lines CL is connected to the predetermined number of pixels EG arranged on the same column out of the plurality of pixels EG. Note that in order to distinguish the predetermined number of pixels EG connected to each column signal line CL from each other, suffixes 1 to n are added to the pixels EG like EG1 to EGn. The first and second photoelectric converters PD-A and PD-B of each of the plurality of pixels EG are arranged so as to form a plurality of rows and a plurality of columns. The plurality of rows include a row formed by the first photoelectric converters PD-A and a row formed by the second photoelectric converters PD-B.

The first photoelectric converters PD-A and the second photoelectric converters PD-B are defined as sub pixels. A light beam that has passed through the first region of a pupil plane in an image sensing optical system (not shown) (an optical system that forms an image of an object in the pixel array 104) enters each first photoelectric converter PD-A. A light beam that has passed through the second region of the pupil plane in the image sensing optical system enters each second photoelectric converter PD-B. Based on the first image formed by signals of the plurality of first photoelectric converters PD-A and the second image formed by signals of the plurality of second photoelectric converters PD-B, it is possible to obtain phase difference information for focus detection.

The row selection circuit 103 selects the rows in the pixel array 104. Selection of the rows includes an operation of selecting a plurality of sub pixels that form the rows and outputting signals from the plurality of sub pixels to the plurality of column signal lines. The readout circuit 105 includes a plurality of column circuits (column circuits CC to be described later) that read out signals appearing in the plurality of column signal lines CL, respectively. The column selection circuit 106 sequentially selects signals of one row read out by the readout circuit 105 and transmits them to the output circuit 107. The output circuit 107 outputs the signals transmitted from the column selection circuit 106. The image sensing device 1 can include a processing circuit 150 that processes the signals output from the output circuit 107. However, the processing circuit 150 may be a constituent element outside the image sensing device 1.

Figure 2:
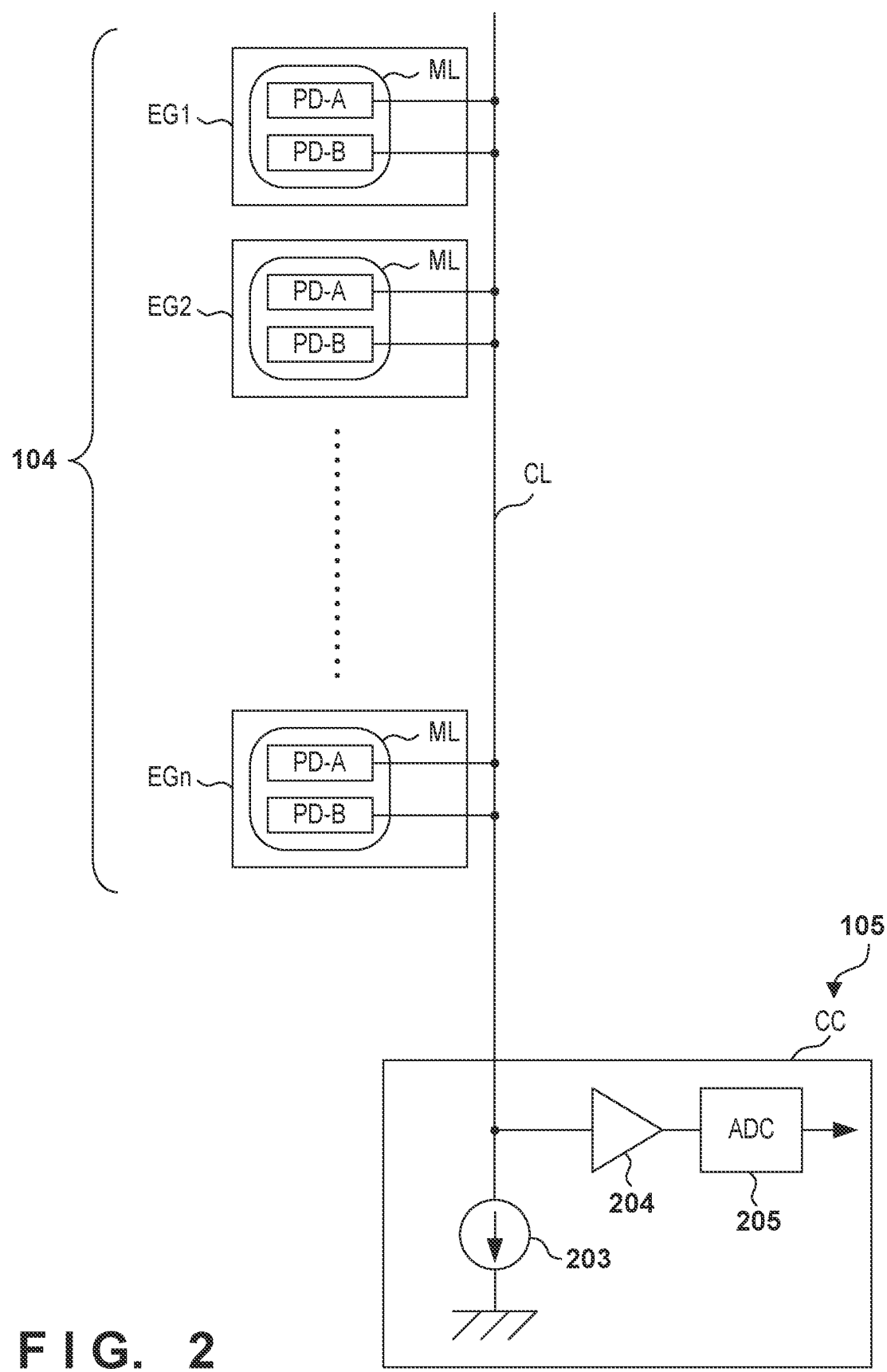
FIG. 2 is a view showing the arrangements of the predetermined number (corresponding to one column) of pixels that share one column signal line in a pixel array and one column circuit of a readout circuit.

FIG. 2 shows the arrangements of the predetermined number (corresponding to one column) of pixels EG1 to EGn that share the one column signal line CL in the pixel array 104 and one column circuit CC of the readout circuit 105. The column circuit CC can include a current source 203 connected to the column signal line CL and a column amplifier 204 connected to the column signal line CL. The column circuit CC may include an A/D converter 205 that converts an analog signal output from the column amplifier 204 into a digital signal.

Figure 3:
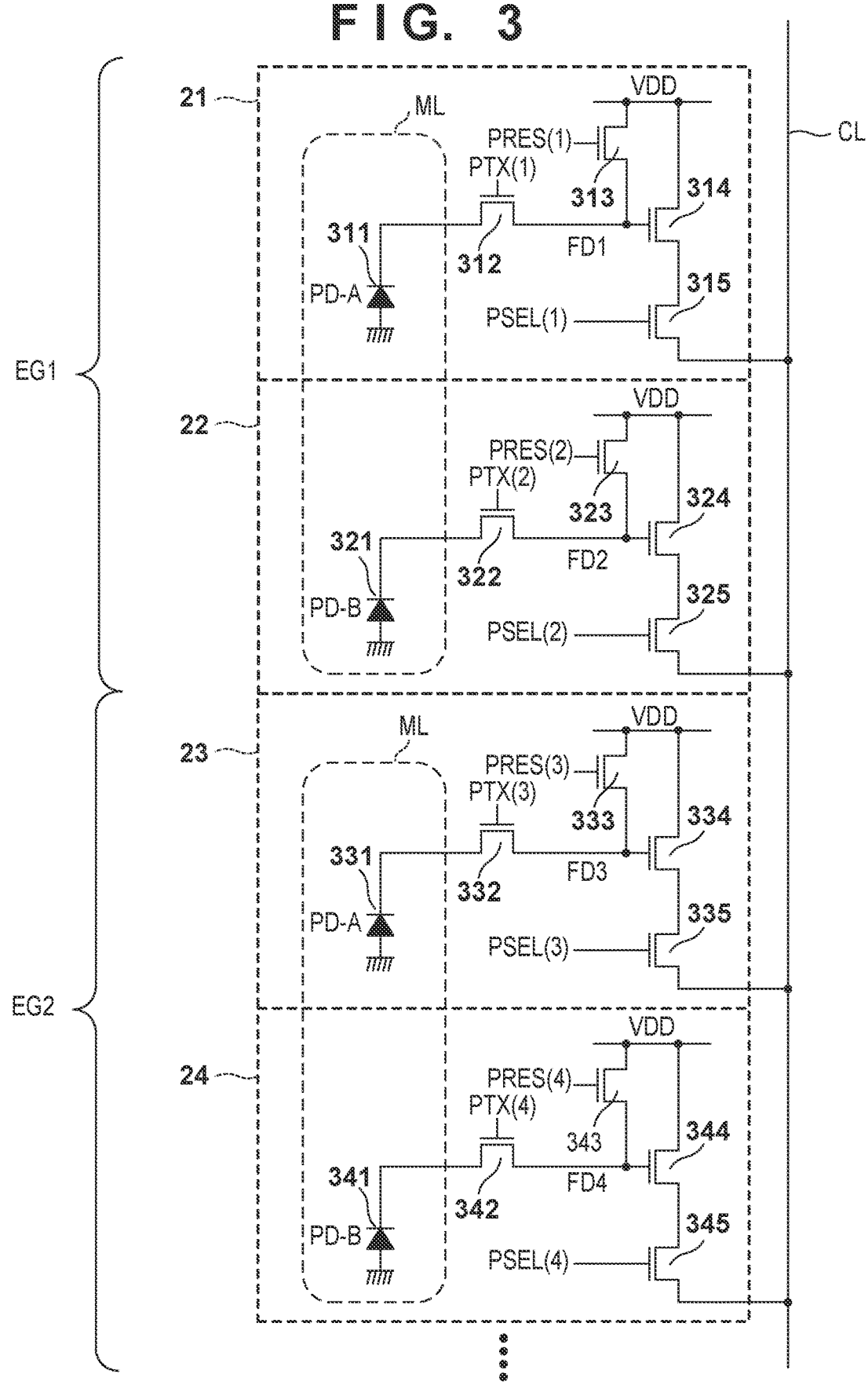
FIG. 3 is a view showing an example of the arrangement of each pixel.

FIG. 3 shows an example of the arrangements of the pixels EG. FIG. 3 shows only the arrangements of the pixels EG1 and EG2 for the sake of convenience. However, the pixels EG1 to EGn have the same arrangement. The pixel EG1 is formed by a first sub pixel 21 and a second sub pixel 22. The first sub pixel 21 and the second sub pixel 22 share one microlens ML.

The first sub pixel 21 includes a first photoelectric converter (PD-A) 311, a first transfer element 312, a first charge-voltage converter FD1, a first reset element 313, a first driving element 314, and a first selection element 315. The first photoelectric converter (PD-A) 311 can be an element that generates charges corresponding to the amount of incident light (photon) and formed by, for example, a photodiode.

The first transfer element 312 is arranged between the first photoelectric converter (PD-A) 311 and the first charge-voltage converter FD1. In accordance with activation of a transfer signal PTX(1) driven by the row selection circuit 103, the first transfer element 312 transfers the charges generated by the first photoelectric converter (PD-A) 311 to the first charge-voltage converter FD1.

The first reset element 313 is arranged between a power supply voltage VDD and the first charge-voltage converter FD1. In accordance with activation of a reset signal PRES(1) driven by the row selection circuit 103, the first reset element 313 performs a reset operation of resetting the first charge-voltage converter FD1 (an input of the first driving element 314) to a potential corresponding to the power supply voltage VDD.

In accordance with the charges generated by the first photoelectric converter (PD-A) 311, the first driving element 314 drives the column signal line CL corresponding to the first sub pixel 21 (shared by the first sub pixel 21) out of the plurality of column signal lines CL. Alternatively, in accordance with the potential of the first charge-voltage converter FD1, the first driving element 314 drives the column signal line CL corresponding to the first sub pixel 21 (shared by the first sub pixel 21) out of the plurality of column signal lines CL. The first driving element 314 is formed by a transistor whose gate is connected to the first charge-voltage converter FD1. The first driving element 314 and the current source 203 of the column circuit CC form a source follower circuit.

The first selection element 315 is turned on in accordance with activation of a selection signal PSEL(1) driven by the row selection circuit 103 and connects the first driving element 314 to the column signal line CL corresponding to the first sub pixel 21 (shared by the first sub pixel 21) out of the plurality of column signal lines CL. This means that the first sub pixel 21 to which the first selection element 315 belongs is set in a selected state. Note that an arrangement may be adopted, which sets the first sub pixel 21 in the selected state or an unselected state by controlling a potential for resetting the first charge-voltage converter FD1 by the first reset element 313 without providing the first selection element 315.

The second sub pixel 22 has the same arrangement as the first sub pixel 21. The second sub pixel 22 includes a second photoelectric converter (PD-B) 321, a second transfer element 322, a second charge-voltage converter FD2, a second reset element 323, a second driving element 324, and a second selection element 325. The second photoelectric converter (PD-B) 321 can be an element that generates charges corresponding to the amount of incident light (photon) and formed by, for example, a photodiode.

The second transfer element 322 is arranged between the second photoelectric converter (PD-B) 321 and the second charge-voltage converter FD2. In accordance with activation of a transfer signal PTX(2) driven by the row selection circuit 103, the second transfer element 322 transfers the charges generated by the second photoelectric converter (PD-B) 321 to the second charge-voltage converter FD2.

The second reset element 323 is arranged between the power supply voltage VDD and the second charge-voltage converter FD2. In accordance with activation of a reset signal PRES(2) driven by the row selection circuit 103, the second reset element 323 performs a reset operation of resetting the second charge-voltage converter FD2 (an input of the second driving element 324) to a potential corresponding to the power supply voltage VDD.

In accordance with the charges generated by the second photoelectric converter (PD-B) 321, the second driving element 324 drives the column signal line CL corresponding to the second sub pixel 22 (shared by the second sub pixel 22) out of the plurality of column signal lines CL. Alternatively, in accordance with the potential of the second charge-voltage converter FD2, the second driving element 324 drives the column signal line CL corresponding to the second sub pixel 22 (shared by the second sub pixel 22) out of the plurality of column signal lines CL. The second driving element 324 is formed by a transistor whose gate is connected to the second charge-voltage converter FD2. The second driving element 324 and the current source 203 of the column circuit CC form a source follower circuit.

The second selection element 325 is turned on in accordance with activation of a selection signal PSEL(2) driven by the row selection circuit 103 and connects the second driving element 324 to the column signal line CL corresponding to the second sub pixel 22 (shared by the second sub pixel 22) out of the plurality of column signal lines CL. This means that the second sub pixel 22 to which the second selection element 325 belongs is set in a selected state. Note that an arrangement may be adopted, which sets the second sub pixel 22 in the selected state or an unselected state by controlling a potential for resetting the second charge-voltage converter FD2 by the second reset element 323 without providing the second selection element 325.

The third pixel EG3 to the nth pixel EGn also have the same arrangement as the first and second pixels EG1 and EG2.

The image sensing device 1 of this embodiment includes a synthesizing readout operation and a noise readout operation as readout operations by the readout circuit 105 (column circuit CC). In the synthesizing readout operation, each column circuit CC reads out a signal of the corresponding column signal line CL out of the plurality of column signal lines CL in a state in which signals are output to the column signal line CL from both the first and second driving elements which are included in the pixels EG connected to the column signal line CL. In the noise readout operation, each column circuit CC reads out noise of the column signal lines CL in a state in which noises are output to the column signal lines CL from both the first and second driving elements after the reset operations by the first and second reset elements, and before transfer operations by the first and second transfer elements.

Figure 4:
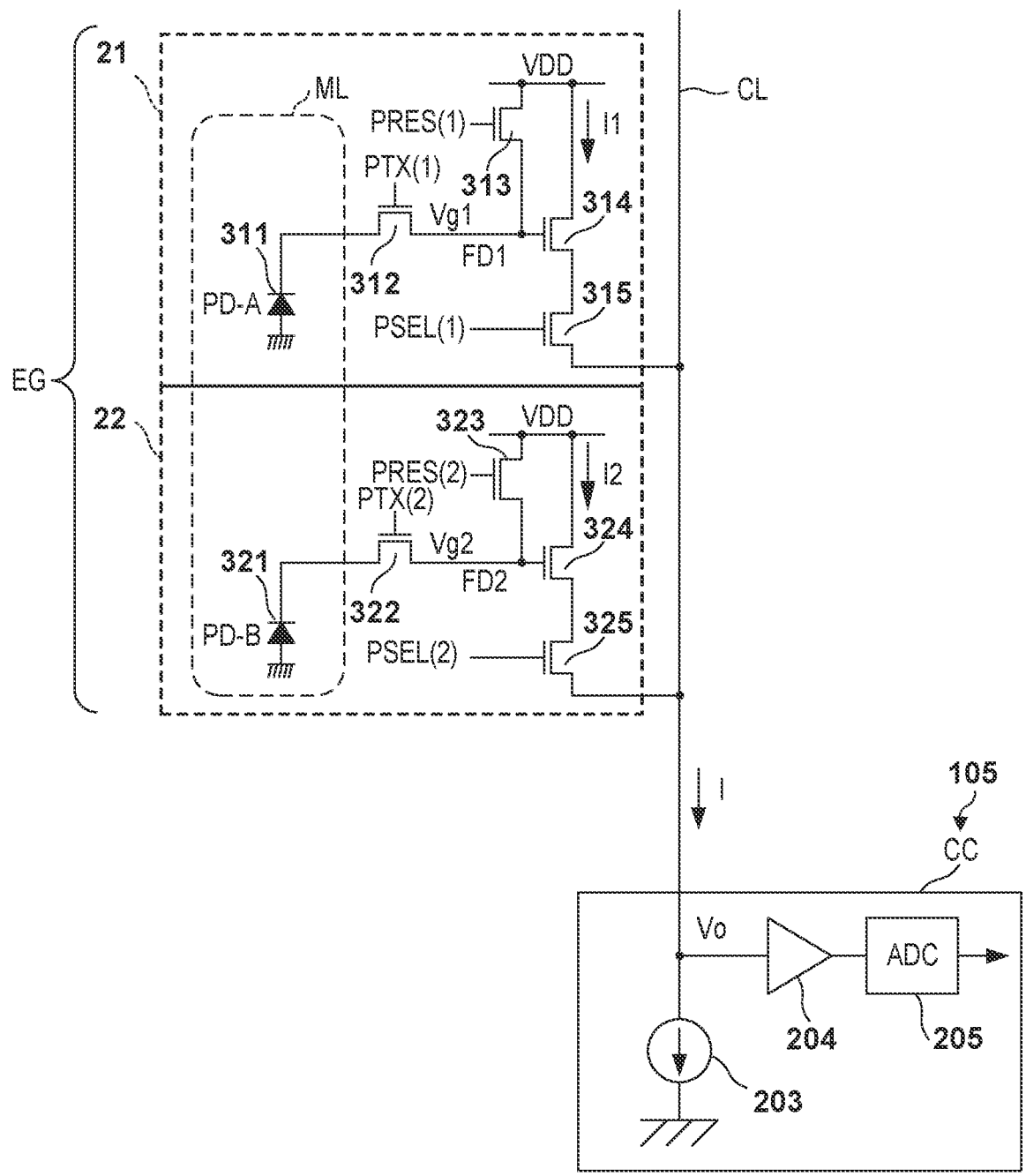
FIG. 4 is a circuit diagram for explaining the principles of a synthesizing readout operation and noise readout operation.

Referring to FIG. 4, the principles of the synthesizing readout operation and noise readout operation will be described. FIG. 4 shows the first sub pixel 21 and second sub pixel 22 as representatives of the first sub pixel and the second sub pixel that form the pixel EG. Synthesizing readout operations and noise readout operations from the first sub pixel 21 and second sub pixel 22 will be described below. However, the same also applies to a synthesizing readout operation and noise readout operation from another pixel.

Assume that the first and second sub pixels 21 and 22, and the column circuit CC are arranged such that both the first and second driving elements 314 and 324 are set in a conductive state, and drive the column signal line CL when the first and second sub pixels 21 and 22 are set in the selected state. In general, there is no large difference between the amount of light entering the first photoelectric converter 311 of the first sub pixel 21 and the amount of light entering the second photoelectric converter 321 of the second sub pixel 22, which share the microlens ML. Therefore, a difference between potentials applied to the respective gates of the first and second driving elements 314 and 324 is smaller than a threshold of the transistors that form the first and second driving elements 314 and 324.

Letting I1 be a current flowing through the first driving element 314, I2 be a current flowing through the second driving element 324, and I be a current flowing through the current source 203, I1+I2=I holds, thus holding:

$$\frac{k}{2}(Vg1 - Vo - Vth)^2 + \frac{k}{2}(Vg2 - Vo - Vth)^2 = I \quad (1)$$

Note that the first term of a left-hand side in equation 1 is I1, the second term of the left-hand side is I2, and they are the currents between the source and drain of a transistor that operates in a saturated region. Let Vg1 be an input potential to the first driving element 314, that is, a gate potential (a potential of the first charge-voltage converter FD1) of the transistor that forms the first driving element 314. Let Vg2 be an input potential to the second driving element 324, that is, a gate potential (a potential of the second charge-voltage converter FD2) of the transistor that forms the second driving element 324. Let Vo be a signal (a voltage input to the column amplifier 204) appearing in the column signal line CL. Let Vth be a threshold of the transistors that form the first and second driving elements 314 and 324. Equation (1) gives:

$$V_o = \frac{Vg1 + Vg2}{2} - Vth - \sqrt{\frac{I}{k} - \frac{(Vg1 - Vg2)^2}{4}} \quad (2)$$

$$= \frac{Vg1 + Vg2}{2} - Vth - \sqrt{\frac{I}{k}\left(1 - \frac{k(Vg1 - Vg2)^2}{4I}\right)}$$

Let Vg1N, Vg2N, and VoN be Vg1, Vg2, and Vo in the noise readout operation, respectively. Let (Vg1S+Vg1N), (Vg2S+Vg2N), and (Vos+VoN) be Vg1, Vg2, and Vo in the synthesizing readout operation, respectively. Note that in the synthesizing readout operation, the total of the noise VoN and a signal VoS corresponding to charges generated by a photoelectric converter is read out. The processing circuit 150 can be configured to perform CDS processing, that is, a process of calculating (VoS+VoN)−VoN. As described above, since there is no large difference between the amount of the light entering the first photoelectric converter 311 of the first sub pixel 21 and the amount of the light entering the second photoelectric converter 321 of the second sub pixel 22, which share the microlens ML, the third term of equation 2 can be ignored.

Therefore, by performing the CDS processing, that is, calculating (VoS+VoN)−VoN, the processing circuit 150 can obtain a pseudo average value of the respective signals of the first and second sub pixels 21 and 22 (first and second photoelectric converters 311 and 321) as given by:

$$(VoS + VoN) - VoN = \frac{Vg1S + Vg2S}{2} \quad (3)$$

Figure 5:
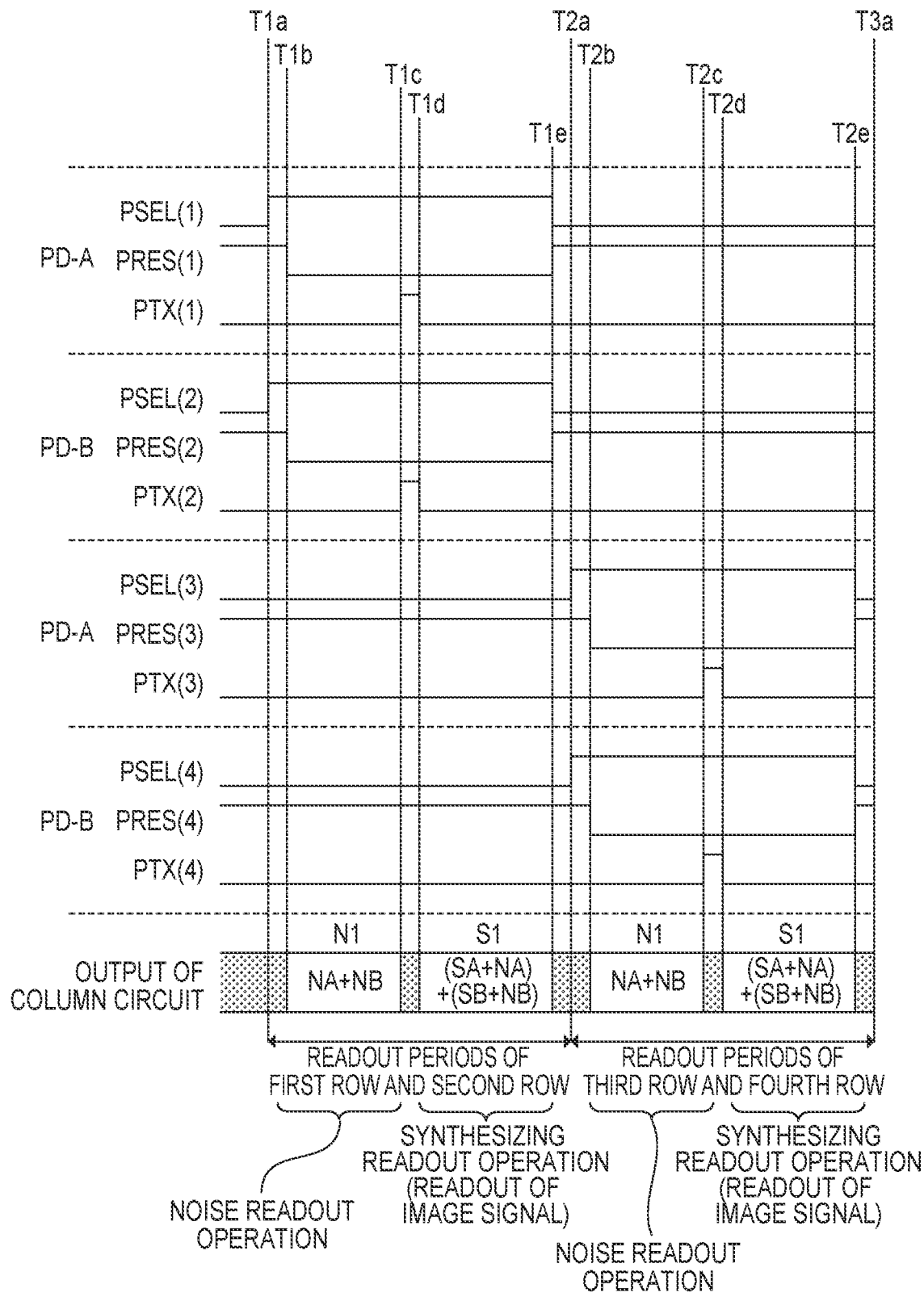
FIG. 5 is a timing chart showing the first operation example of the image sensing device.

Operation examples of the image sensing device 1 will be described below. FIG. 5 shows the first operation example of the image sensing device 1. FIG. 5 shows a readout operation for signals from the first sub pixel 21 arranged on the first row, the second sub pixel 22 arranged on the second row, a first sub pixel 23 arranged on the third row, and a second sub pixel 24 arranged on the fourth row in the first operation example. In the first operation example, the readout operation is performed by a noise readout operation and synthesizing readout operation from a pixel formed by the first sub pixel and the second sub pixel.

At time T1a, PSEL(1) and PSEL(2) change to high level. Therefore, the first selection element 315 of the first sub pixel 21 is turned on, and the first driving element 314 of the first sub pixel 21 is connected to the column signal line CL. Similarly, the second selection element 325 of the second sub pixel 22 is turned on, and the second driving element 324 of the second sub pixel 22 is connected to the column signal line CL. The sub pixels on rows other than these are not connected to the column signal line CL.

The noise readout operation is performed from time T1b to time T1c. At the time T1b, PRES(1) and PRES(2) change to low level. Therefore, the first reset element 313 of the first sub pixel 21 is turned off, and resetting of the first charge-voltage converter FD1 is canceled. Similarly, the second reset element 323 of the second sub pixel 22 is turned off, and resetting of the second charge-voltage converter FD2 is canceled. The first and second charge-voltage converters FD1 and FD2 of the sub pixels on the rows other than these are held in a reset state.

From the time T1b to the time T1c, the first and second charge-voltage converters FD1 and FD2 of the first and second sub pixels 21 and 22 hold a state (noise) immediately after resetting. During this period, the first and second driving elements 314 and 324 of the first and second sub pixels 21 and 22 drive the column signal line CL simultaneously. Therefore, noise N1 corresponding to noises NA and NB of the first and second charge-voltage converters FD1 and FD2 appear in the column signal line CL. The column circuit CC outputs the noise N1 corresponding to the aforementioned VoN.

From the time T1c to time T1d, PTX(1) and PTX(2) change to high level. Therefore, the first transfer element 312 of the first sub pixel 21 is turned on, and charges of the first photoelectric converter (PD-A) 311 are transferred to the first charge-voltage converter FD1. Similarly, the second transfer element 322 of the second sub pixel 22 is turned on, and charges of the second photoelectric converter (PD-B) 321 are transferred to the second charge-voltage converter FD2.

The synthesizing readout operation is performed from the time T1d to time T1e. From the time T1d to the time T1e, the first charge-voltage converter FD1 of the first sub pixel 21 holds the charges and noise generated by the first photoelectric converter 311. Moreover, from the time T1d to the time T1e, the second charge-voltage converter FD2 of the second sub pixel 22 holds the charges and noise generated by the second photoelectric converter 321. During this period, the first and second driving elements 314 and 324 of the first and second sub pixels 21 and 22 drive the column signal line CL simultaneously. Therefore, a signal S1 corresponding to a signal and noise (SA+NA) of the first sub pixel 21, and a signal and noise (SB+NB) of the second sub pixel 22 appears in the column signal line CL. The column circuit CC outputs the signal S1 corresponding to the aforementioned (VoS+VoN). Therefore, based on the noise N1 and the signal S1, the processing circuit 150 can obtain the pseudo average value of the signals of the first and second sub pixels 21 and 22 (first and second photoelectric converters 311 and 321) according to equation (3). This pseudo average value can be used as the signal of the pixel formed by the first and second sub pixels 21 and 22.

At the time T1e, PSEL(1) and PSEL(2) change to low level. Therefore, the first and second selection elements 315 and 325 of the first and second sub pixels 21 and 22 are turned off, and the first and second driving elements 314 and 324 of the first and second sub pixels 21 and 22 are disconnected from the column signal line CL. Moreover, PRES(1) and PRES(2) change to high level. Therefore, the first and second reset elements 313 and 323 of the first and second sub pixels 21 and 22 are turned on, and the first and second charge-voltage converters FD1 and FD2 of the first and second sub pixels 21 and 22 are set in the reset state.

The noise readout operation and synthesizing readout operation from the first sub pixel 21 arranged on the first row and the second sub pixel 22 arranged on the second row in the first operation example are performed as described above. Concerning the other rows, the noise readout operation and the synthesizing readout operation are performed in the same manner.

Figure 6:
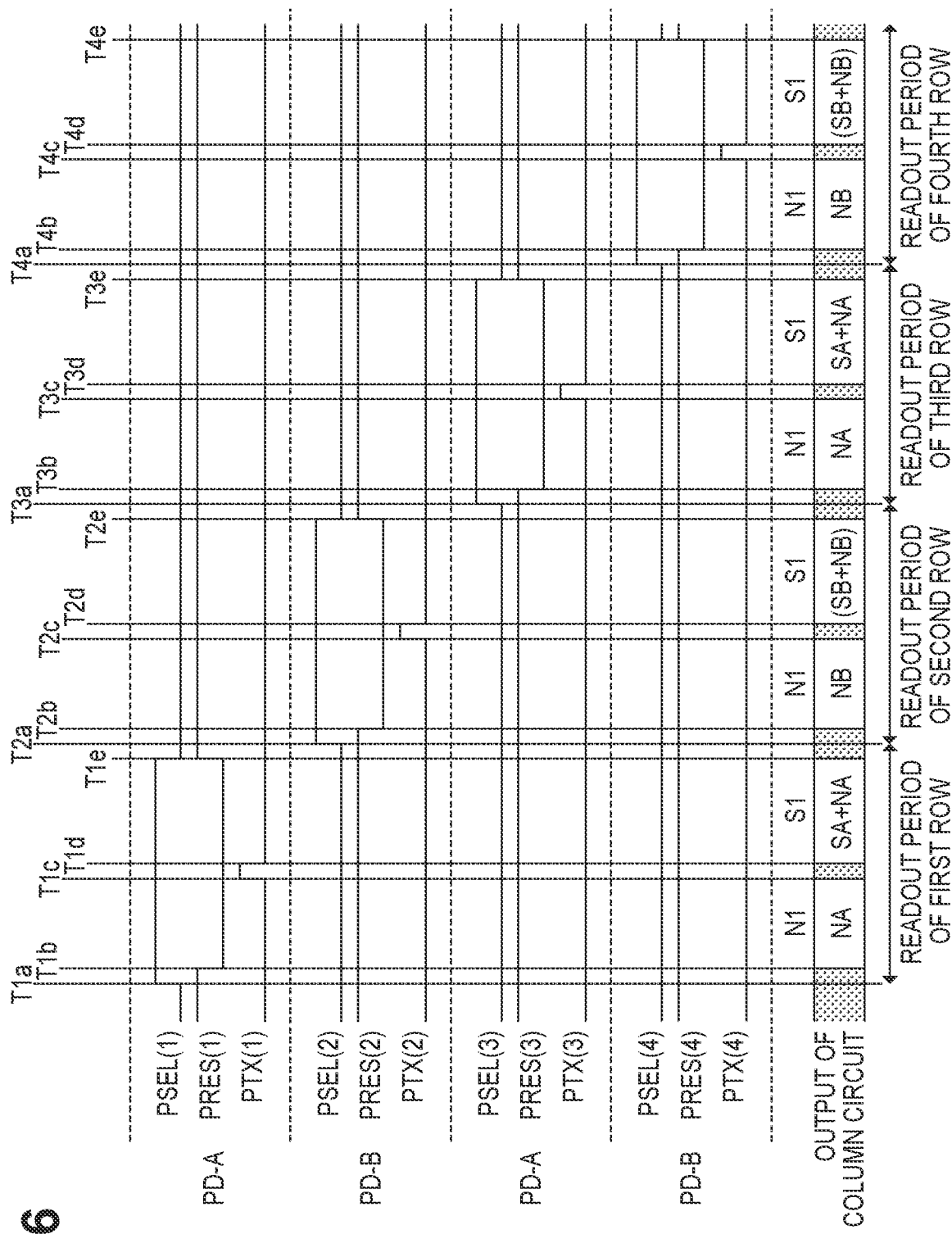
FIG. 6 is a timing chart showing the second operation example of the image sensing device.

FIG. 6 shows the second operation example of the image sensing device 1. FIG. 6 shows a readout operation for signals from the first sub pixel 21 arranged on the first row, the second sub pixel 22 arranged on the second row, the first sub pixel 23 arranged on the third row, and the second sub pixel 24 arranged on the fourth row in the second operation example. In the second operation example, noise and a signal are output from each of the first sub pixel and the second sub pixel.

From the time T1a to the time T1e, the noise N1 and the signal S1 of the first photoelectric converter (PD-A) 311 of the first sub pixel 21 serving as a sub pixel on the first row are read out. At the time T1a, PSEL(1) changes to high level. Therefore, the first selection element 315 of the first sub pixel 21 is turned on, and the first driving element 314 of the first sub pixel 21 is connected to the column signal line CL. The sub pixels on rows other than these are not connected to the column signal line CL.

At the time T1b, PRES(1) changes to low level. Therefore, the first reset element 313 of the first sub pixel 21 is turned off, and resetting of the first charge-voltage converter FD1 is canceled. The first and second charge-voltage converters FD1 and FD2 of the sub pixels on the rows other than these are held in the reset state.

From the time T1b to the time T1c, the first charge-voltage converter FD1 of the first sub pixel 21 holds the state (noise) immediately after resetting. During this period, the first driving element 314 of the first sub pixel 21 drives the column signal line CL. Therefore, the noise N1 corresponding to the noise NA of the first charge-voltage converter FD1 appears in the column signal line CL. The column circuit CC outputs the noise N1.

From the time T1c to the time T1d, PTX(1) is driven to high level. Therefore, the first transfer element 312 of the first sub pixel 21 is turned on, and the charges of the first photoelectric converter (PD-A) 311 are transferred to the first charge-voltage converter FD1.

From the time T1d to the time T1e, the first charge-voltage converter FD1 of the first sub pixel 21 holds the charges and noise generated by the first photoelectric converter 311. During this period, the first driving element 314 of the first sub pixel 21 drives the column signal line CL. Therefore, the signal S1 corresponding to the signal and noise (SA+NA) of the first sub pixel 21 appears in the column signal line CL. The column circuit CC outputs the signal S1. Therefore, based on N1 and S1, the processing circuit 150 can obtain a signal (SA) of the first sub pixel 21.

At the time T1e, PSEL(1) changes to low level. Therefore, the first selection element 315 of the first sub pixel 21 is turned off, and the first sub pixel 21 (the first driving element 314 thereof) is disconnected from the column signal line CL. Moreover, at the time T1e, PRES(1) changes to high level. Therefore, the first reset element 313 of the first sub pixel 21 is turned on, and the first charge-voltage converter FD1 of the first sub pixel 21 is set in the reset state.

The noise and signal readout operation from the first sub pixel 21 arranged on the first row in the second operation example is performed as described above. Concerning the other rows, the noise and signal readout operation is performed in the same manner.

Figure 7:
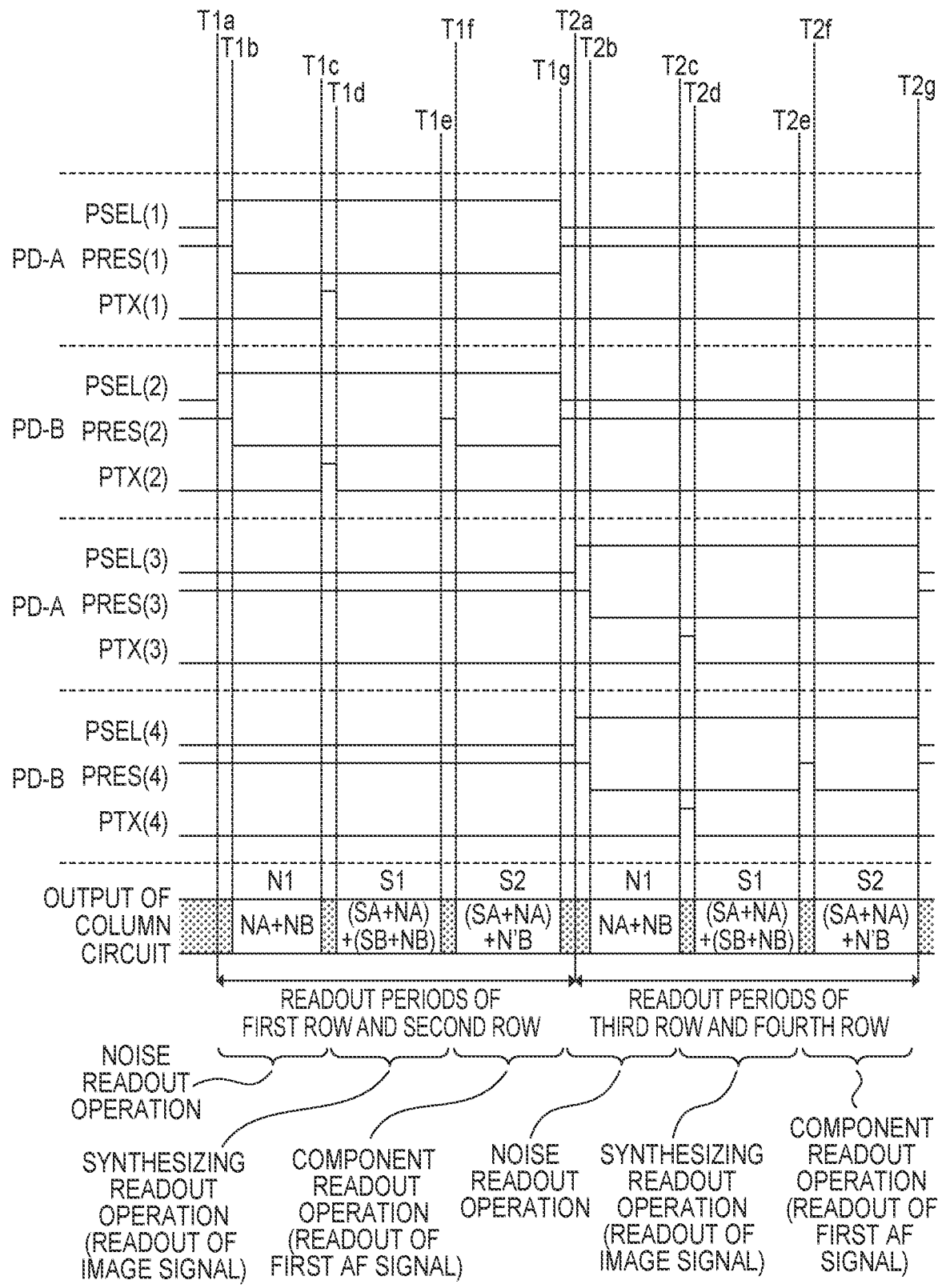
FIG. 7 is a timing chart showing the third operation example of the image sensing device.

FIG. 7 shows the third operation example of the image sensing device 1. FIG. 7 shows a readout operation for signals from the first sub pixel 21 arranged on the first row, the second sub pixel 22 arranged on the second row, the first sub pixel 23 arranged on the third row, and the second sub pixel 24 arranged on the fourth row in the third operation example. In the third operation example, a noise readout operation, synthesizing readout operation, and component readout operation from a pixel formed by the first sub pixel and the second sub pixel are performed. The component readout operation is an operation of reading out a signal appearing in the column signal line by the column circuit in a state in which the first and second driving elements drive the column signal line simultaneously after a reset operation of resetting one of the first and second charge-voltage converters of the pixel is performed after the synthesizing readout operation.

Operations from the time T1a to the time T1e (the noise readout operation and a synthesizing signal readout operation) are the same as in the first operation example. From the time T1e to time T1f, PRES(2) is driven to high level. Therefore, the second reset element 323 of the second sub pixel 22 is turned on, and the second charge-voltage converter FD2 is reset. On the other hand, PRES(1) holds a low level state, and the first reset element 313 of the first sub pixel 21 remains turned off. Therefore, the first charge-voltage converter FD1 of the first sub pixel 21 is not reset, and keeps holding the charges and noise of the first photoelectric converter (PD-A) 311.

At the time T1f, PRES(2) changes to low level. Therefore, the second reset element 323 of the second sub pixel 22 is turned off, and resetting of the second charge-voltage converter FD2 is canceled. From the time T1f to time T1g, the first charge-voltage converter FD1 of the first sub pixel 21 holds the charges and noise of the first photoelectric converter (PD-A) 311, and the second charge-voltage converter FD2 of the second sub pixel 22 holds the state (noise) immediately after resetting. During this period, the first and second driving elements 314 and 324 of the first and second sub pixels 21 and 22 drive the column signal line CL simultaneously. Therefore, a signal S2 corresponding to the signal and noise (SA+NA) of the first sub pixel 21, and noise (NB') of the second sub pixel 22 appears in the column signal line CL. The column circuit CC outputs the signal S2. Let NB be noise of the second sub pixel 22 because it is noise obtained by canceling resetting at time different from the time T1b.

At the time T1g, PSEL(1) and PSEL(2) change to low level. Therefore, the first and second reset elements 313 and 323 of the first and second sub pixels 21 and 22 are turned on, and the first and second charge-voltage converters FD1 and FD2 of the first and second sub pixels 21 and 22 are set in the reset state.

The noise readout operation, synthesizing readout operation, and component readout operation from the pixel formed by the first sub pixel 21 arranged on the first row and the second sub pixel 22 arranged on the second row are performed as described above. Concerning the subsequent rows, the noise readout operation, the synthesizing readout operation, and the component readout operation are performed in the same manner.

As described in the first operation example, based on the noise N1 and the signal S1, the processing circuit 150 can obtain, as an image signal, the pseudo average value of the signals of the first and second sub pixels 21 and 22 (first and second photoelectric converters 311 and 321) according to equation (3).

The processing circuit 150 can also obtain a signal (SA+(NB−NB)) of the first photoelectric converter (PD-A) 311 as the first component signal (first AF signal) by subtracting the noise N1 (=NA+NB) from the signal S2 (=(SA+NA)+N'B). The signal of the first photoelectric converter (PD-A) 311 can be used as one of two component signals for focus detection. Note that a difference between the noise NB and the noise N'B becomes an error of a signal obtained from the first photoelectric converter (PD-A) 311. It is possible, however, to allow the error caused by the difference between the noise NB and the noise N'B because an accuracy required of a signal for focus detection is lower than an accuracy required of an image signal (a signal read out by the synthesizing signal readout operation).

The processing circuit 150 can further obtain the second component signal (second AF signal) based on the image signal and the first component signal (first AF signal). More specifically, the processing circuit 150 can obtain the second component signal (second AF signal) by subtracting the first component signal (first AF signal) from the image signal. That is, the processing circuit 150 can perform an arithmetic operation for focusing based on a signal read out in the synthesizing readout operation by the readout circuit 105 and a signal read out in the component readout operation by the readout circuit 105. Note that the first component signal is a signal of light that has passed through the first region of the pupil plane in the image sensing optical system, and the second component signal is a signal of light that has passed through the second region of the pupil plane in the image sensing optical system. Based on the first component signal and the second component signal, an AF circuit (not shown) can obtain a phase difference (that is, a defocus amount) between the light that has passed through the first region and the light that has passed through the second region, and perform a focusing operation (AF operation).

In the fourth operation example, for some pixels out of the plurality of pixels EG, a synthesizing readout operation and a component readout operation are performed, and for some other pixels out of the plurality of pixels EG, the synthesizing readout operation is performed, but the component readout operation is not performed.

Figure 8:
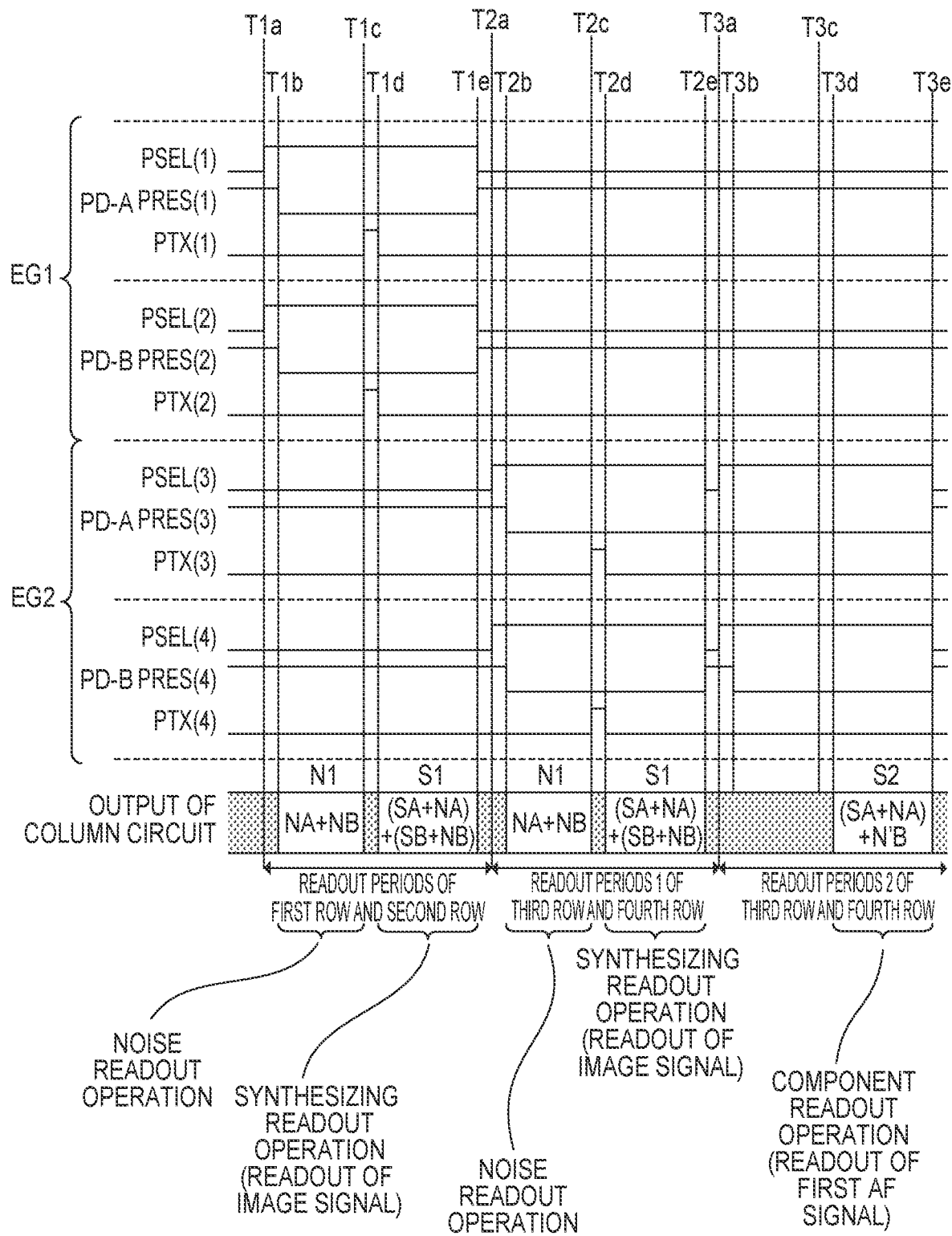
FIG. 8 is a timing chart showing the fourth operation example of the image sensing device.

FIG. 8 shows the fourth operation example of the image sensing device 1. FIG. 8 shows a readout operation for signals from the first sub pixel 21 arranged on the first row, the second sub pixel 22 arranged on the second row, the first sub pixel 23 arranged on the third row, and the second sub pixel 24 arranged on the fourth row in the fourth operation example. In the fourth operation example, for the second pixel EG2 of the first type out of the plurality of pixels EG, the synthesizing readout operation and the component readout operation are performed. Moreover, in the fourth operation example, for the pixel EG1 of the second type out of the plurality of pixels EG, the synthesizing readout operation is performed, but the component readout operation is not performed.

In a period from the time T1a to the time T1e, a noise readout operation and the synthesizing readout operation are performed from the first sub pixel 21 on the first row and the second sub pixel 22 on the second row, as an example, which form the second pixel EG2 of the second type. The operations from the time T1a to the time T1e are the same as in the first operation example. Based on the noise N1 and the signal S1 read out in the period from the time T1a to the time T1e, the processing circuit 150 can obtain, as the image signal, the pseudo average value of the signals of the first and second sub pixels 21 and 22 (first and second photoelectric converters 311 and 321) according to equation (3).

In a period from time T2a to time T3e, the noise readout operation, synthesizing readout operation, and component readout operation from the first sub pixel 23 on the third row and the second sub pixel 24 on the fourth row, as an example, which form the pixel EG1 of the first type are performed.

From the time T2a to time T2e, the first sub pixel 23 on the third row and the second sub pixel 24 on the fourth row, as an example, which form the pixel EG2 of the first type are selected, and the same operations as those from the time T1a to the time T1e are performed. That is, from the time T2a to the time T2e, the noise readout operation and synthesizing readout operation from the first sub pixel 23 on the third row and the second sub pixel 24 on the fourth row, as the example, which form the second pixel EG2 of the first type are performed. Based on the noise N1 and the signal S1, the processing circuit 150 can obtain, as an image signal, a pseudo average value of the signals of the first and second sub pixels 23 and 24 (first and second photoelectric converters 331 and 341) according to equation (3).

At the time T2e, PSEL(3) and PSEL(4) change to low level. Therefore, a first selection element 335 of the first sub pixel 23 is turned off, and a first driving element 334 of the first sub pixel 23 is disconnected from the column signal line CL. Moreover, at the time T2e, PRES(4) changes to high level. Therefore, a second reset element 343 of the second sub pixel 24 is turned on, and the second charge-voltage converter FD2 is reset. On the other hand, PRES(3) is held at low level, and thus the first charge-voltage converter FD1 of the first sub pixel 23 is not reset. Therefore, the first charge-voltage converter FD1 of the first sub pixel 23 keeps holding charges and noise of the first photoelectric converter (PD-A) 331.

At time T3a, PSEL(3) and PSEL(4) change to high level. Therefore, the first selection element 335 of the first sub pixel 23 is turned on, and the first driving element 334 of the first sub pixel 23 is connected to the column signal line CL. Moreover, at the time T3a, a second selection element 345 of the second sub pixel 24 is turned on, and a second driving element 344 of the second sub pixel 24 is connected to the column signal line CL. The sub pixels on rows other than these are not connected to the column signal line CL.

At time T3b, PRES(4) changes to low level. Therefore, the second reset element 343 of the second sub pixel 24 is turned off, and resetting of the second charge-voltage converter FD2 of the second sub pixel 24 is canceled. Moreover, a first reset element 333 of the first sub pixel 23 remains turned off, and the first charge-voltage converter FD1 of the first sub pixel 23 keeps holding the charges and noise of the first photoelectric converter (PD-A) 331.

A period from the time T3b to time T3c can be provided as a waiting time. In a period from time T3d to the time T3e, the first charge-voltage converter FD1 of the first sub pixel 23 holds the charges and noise of the first photoelectric converter (PD-A) 331, and the second charge-voltage converter FD2 of the second sub pixel 24 holds the state (noise) immediately after resetting. During this period, the first and second driving elements 334 and 344 of the first and second sub pixels 23 and 24 drive the column signal line CL simultaneously. Therefore, the signal S2 corresponding to the signal and noise (SA+NA) of the first sub pixel 23, and the noise (NB) of the second sub pixel 24 appears in the column signal line CL. The column circuit CC outputs the signal S2. Let NB be the noise of the second sub pixel 24 because it is noise obtained by canceling resetting at time different from the time T2b.

Let t1 be a time (T2b to T2d) from the end of the reset operation (T2b) immediately before a synthesizing readout operation (T2d to T2e) for the signals of the first and second sub pixels 23 and 24 of the second pixel EG2 of the first type to the synthesizing readout operation. Let t2 be a time (T3b to T3d) from the end of the reset operation (T3b) immediately before a component readout operation (T3d to T3e) for the second pixel EG2 of the first type to the component readout operation. In the fourth operation example, t1=t2 can hold. This makes it possible to cancel noise in the signal S2 accurately.

At the time T3e, PSEL(3) and PSEL(4) change to low level. Therefore, the first and second selection elements 335 and 345 of the first and second sub pixels 23 and 24 are turned off, and the first and second driving elements 334 and 344 of the first and second sub pixels 23 and 24 are disconnected from the column signal line CL. Moreover, PRES(3) and PRES(4) change to high level. Therefore, the first and second reset elements 333 and 343 of the first and second sub pixels 23 and 24 are turned on, and the first and second charge-voltage converters FD1 and FD2 of the first and second sub pixels 23 and 24 are set in the reset state.

The processing circuit 150 can obtain the signal (SA+(N'B−NB)) of the first photoelectric converter (PD-A) 331 as the first component signal (first AF signal) by subtracting the noise N1 (=NA+NB) from the signal S2 (=(SA+NA)+N'B). The signal of the first photoelectric converter (PD-A) 311 can be used as one of two component signals for focus detection. Note that the difference between the noise NB and the noise NB becomes the error of the signal obtained from the first photoelectric converter (PD-A) 311. It is possible, however, to allow the error caused by the difference between the noise NB and the noise NB because the accuracy required of the signal for focus detection is lower than the accuracy required of the image signal (the signal read out by the synthesizing signal readout operation). The processing circuit 150 can obtain the second component signal (second AF signal) by subtracting the first component signal (first AF signal) from the image signal.

Hereinafter, for the pixel of the second type, a signal is read out by the same noise readout operation and synthesizing readout operation as the operations from the time T1a to the time T1e. Moreover, for the pixel of the first type, the same noise readout operation, synthesizing readout operation, and component readout operation as the operations from the time T2a to the time T3e are performed.

Figure 9:
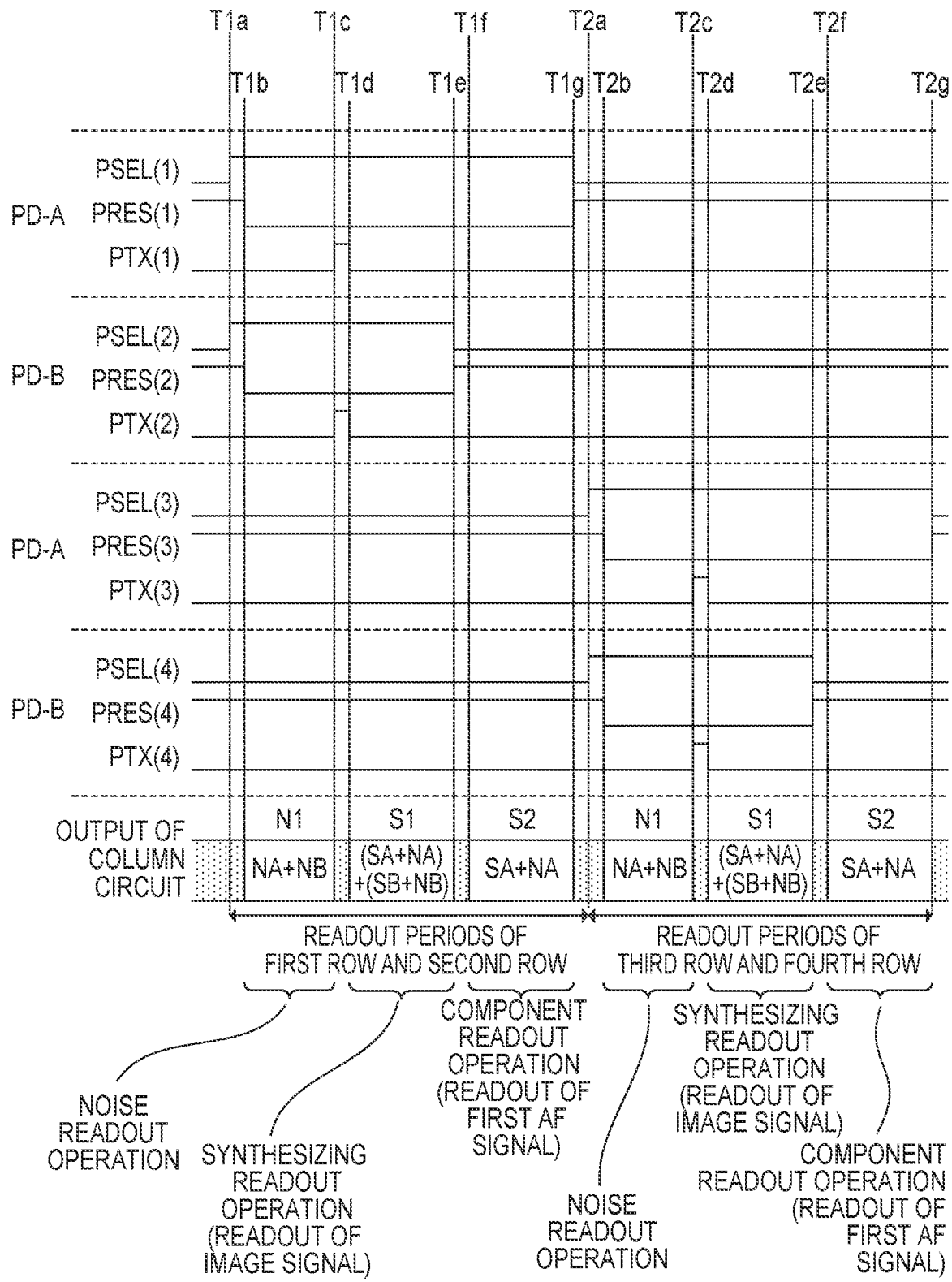
FIG. 9 is a timing chart showing the fifth operation example of the image sensing device.

FIG. 9 shows the fifth operation example of the image sensing device 1. FIG. 9 shows a readout operation for signals from the first sub pixel 21 arranged on the first row, the second sub pixel 22 arranged on the second row, the first sub pixel 23 arranged on the third row, and the second sub pixel 24 arranged on the fourth row in the fifth operation example. In the fifth operation example, a noise readout operation, synthesizing readout operation, and component readout operation from a pixel formed by the first sub pixel and the second sub pixel are performed. In the fifth operation example, in a readout operation for a signal from each pixel, the noise readout operation, the synthesizing readout operation, and the component readout operation are also performed. In the component readout operation in the fifth operation example, each column circuit CC reads out a signal appearing in a corresponding one of the column signal lines CL in a state in which the first driving element drives the column signal line CL, and the second driving element does not drive the column signal line CL.

The operations from the time T1a to the time T1e are the same as in the third operation example. At the time T1e, PSEL(2) changes to low level. Therefore, the second selection element 325 of the second sub pixel 22 is turned off, and the second driving element 324 of the second sub pixel 22 is disconnected from the column signal line CL. Moreover, at the time T1e, PRES(2) changes to high level. Therefore, the second reset element 323 of the second sub pixel 22 is turned on, and the second charge-voltage converter FD2 is reset. On the other hand, PRES(1) holds the low level state, and the first reset element 313 of the first sub pixel 21 remains turned off. Therefore, the first charge-voltage converter FD1 of the first sub pixel 21 is not reset, and keeps holding the charges and noise of the first photoelectric converter (PD-A) 311.

From the time T1f to the time T1g, the first charge-voltage converter FD1 of the first sub pixel 21 holds the charges and noise of the first photoelectric converter 311. During this period, the first driving element 314 the first sub pixel 21 drives the column signal line CL, and the second driving element 324 of the second sub pixel 22 is disconnected from the column signal line CL. Therefore, the signal S2 corresponding to the signal and noise (SA+NA) of the first sub pixel 23 appears in the column signal line CL. The column circuit CC outputs the signal S2.

At the time T1g, PSEL(1) changes to low level. Therefore, the first selection element 315 of the first sub pixel 21 is turned off, and the first driving element 314 of the first sub pixel 21 is disconnected from the column signal line CL. Moreover, at the time T1g, PRES(1) changes to high level. Therefore, the first reset element 313 of the first sub pixel 21 is turned on, and the first charge-voltage converter FD1 of the first sub pixel 21 is set in the reset state.

The noise readout operation, synthesizing readout operation, and component readout operation from the first sub pixel 21 arranged on the first row and the second sub pixel 22 arranged on the second row are performed as described above. Concerning the subsequent rows, the noise readout operation, the synthesizing readout operation, and the component readout operation are performed in the same manner.

Based on the noise N1 and the signal S1, the processing circuit 150 can obtain, as the image signal, the pseudo average value of the signals of the first and second sub pixels 21 and 22 (first and second photoelectric converters 311 and 321) according to equation (3).

The processing circuit 150 can also obtain a signal (SA+(NA−NB)/2) of the first photoelectric converter (PD-A) 311 as the first component signal (first AF signal) by subtracting half the noise N1 (=(NA+NB)/2) from the signal S2 (=SA+NA). A difference between the noise NA and the noise NB becomes an error of a signal obtained from the first photoelectric converter (PD-A) 311. It is possible, however, to allow the error caused by the difference between the noise NA and the noise NB because the accuracy required of the signal for focus detection is lower than the accuracy required of the image signal (the signal read out by the synthesizing signal readout operation). The processing circuit 150 can further obtain the second component signal (second AF signal) by subtracting the first component signal (first AF signal) from the image signal.

Figure 10:
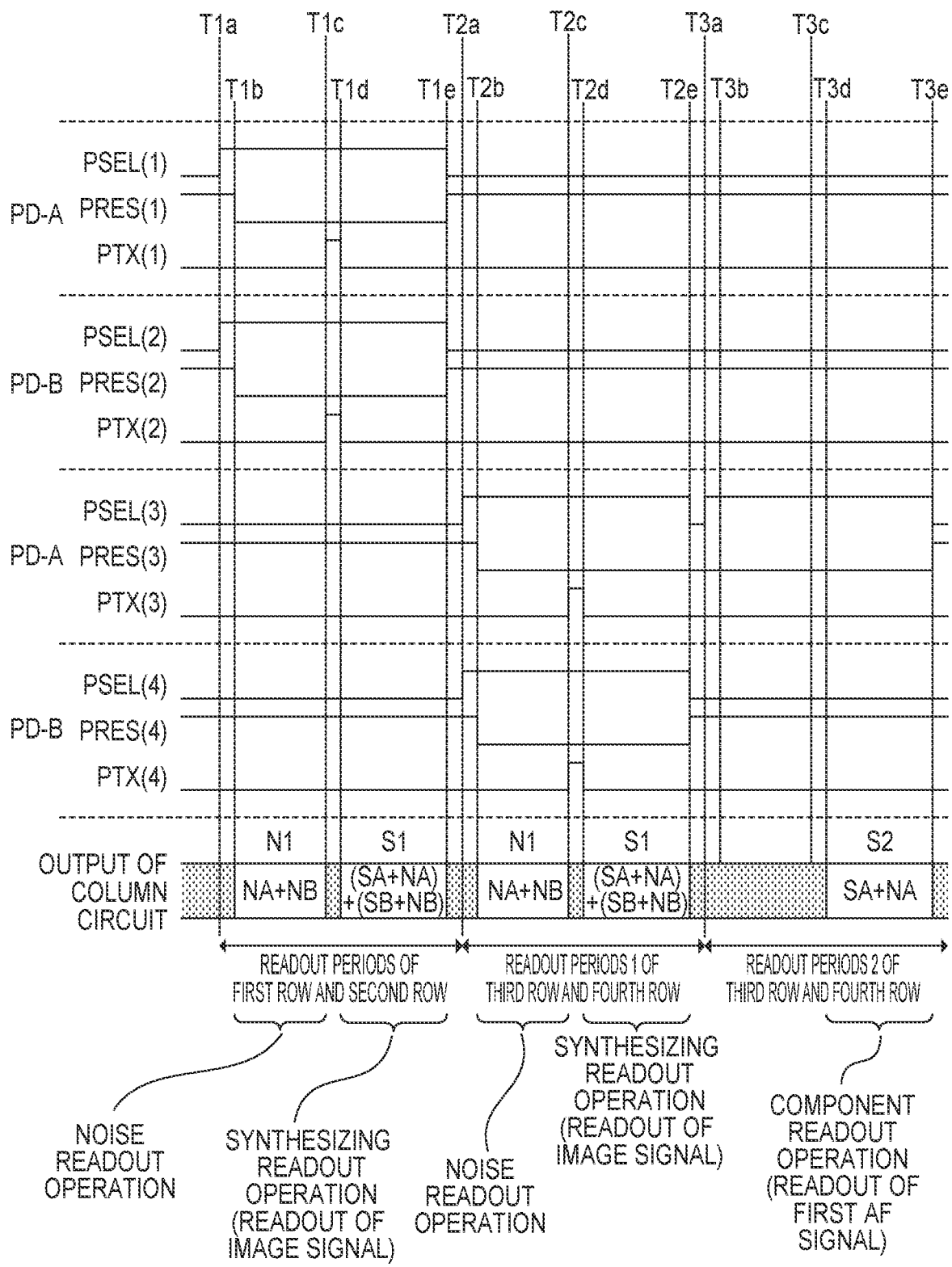
FIG. 10 is a timing chart showing the sixth operation example of the image sensing device.

FIG. 10 shows the sixth operation example of the image sensing device 1. FIG. 10 shows a readout operation for signals from the first sub pixel 21 arranged on the first row, the second sub pixel 22 arranged on the second row, the first sub pixel 23 arranged on the third row, and the second sub pixel 24 arranged on the fourth row in the sixth operation example. In the sixth operation example, for the second pixel EG2 of the first type out of the plurality of pixels EG, the synthesizing readout operation and the component readout operation are performed. Moreover, in the sixth operation example, for the pixel EG1 of the second type out of the plurality of pixels EG, the synthesizing readout operation is performed, but the component readout operation is not performed.

In the period from the time T1a to the time T1e, a noise readout operation and the synthesizing readout operation are performed from the first sub pixel 21 on the first row and the second sub pixel 22 on the second row, as the example, which form the second pixel EG2 of the second type. The operations from the time T1a to the time T1e are the same as in the first operation example. Based on the noise N1 and the signal S1 read out in the period from the time T1a to the time T1e, the processing circuit 150 can obtain, as the image signal, the pseudo average value of the signals of the first and second sub pixels 21 and 22 (first and second photoelectric converters 311 and 321) according to equation (3).

In the period from the time T2a to the time T3e, the noise readout operation, synthesizing readout operation, and component readout operation from the first sub pixel 23 on the third row and the second sub pixel 24 on the fourth row, as the example, which form the pixel EG1 of the first type are performed.

From the time T2a to the time T2e, the first sub pixel 23 on the third row and the second sub pixel 24 on the fourth row, as the example, which form the pixel EG2 of the first type are selected, and the same operations as those from the time T1a to the time T1e are performed. That is, from the time T2a to the time T2e, the noise readout operation and synthesizing readout operation from the first sub pixel 23 on the third row and the second sub pixel 24 on the fourth row, as the example, which form the second pixel EG2 of the first type are performed. Based on the noise N1 and the signal S1, the processing circuit 150 can obtain, as the image signal, the pseudo average value of the signals of the first and second sub pixels 23 and 24 (first and second photoelectric converters 331 and 341) according to equation (3).

At the time T2e, PSEL(3) and PSEL(4) change to low level. Therefore, the first selection element 335 of the first sub pixel 23 is turned off, and the first driving element 334 of the first sub pixel 23 is disconnected from the column signal line CL. Moreover, at the time T2e, PRES(4) changes to high level. Therefore, the second reset element 343 of the second sub pixel 24 is turned on, and the second charge-voltage converter FD2 is reset. On the other hand, PRES(3) is held at low level, and thus the first charge-voltage converter FD1 of the first sub pixel 23 is not reset. Therefore, the first charge-voltage converter FD1 of the first sub pixel 23 keeps holding charges and noise of the first photoelectric converter 331.

At the time T3a, PSEL(3) and PSEL(4) change to high level. Therefore, the first selection element 335 of the first sub pixel 23 is turned on, and the first driving element 334 of the first sub pixel 23 is connected to the column signal line CL. Moreover, at the time T3a, the second selection element 345 of the second sub pixel 24 is turned on, and the second driving element 344 of the second sub pixel 24 is connected to the column signal line CL. The sub pixels on rows other than these are not connected to the column signal line CL.

The period from the time T3b to the time T3c can be provided as the waiting time. In the period from the time T3d to the time T3e, the first charge-voltage converter FD1 of the first sub pixel 23 holds the charges and noise of the first photoelectric converter 331. During this period, a first charge-voltage converter FD3 of the first sub pixel 23 holds the charges and noise of the first photoelectric converter 331. During this period, the first driving element 334 of the first sub pixel 23 drives the column signal line CL, and the second driving element 344 of the second sub pixel 24 is disconnected from the column signal line CL. Therefore, the signal S2 corresponding to the signal and noise (SA+NA) of the first sub pixel 23 appears in the column signal line CL. The column circuit CC outputs the signal S2.

At the time T3e, PSEL(3) changes to low level. Therefore, the first selection element 335 of the first sub pixel 23 is turned off, and the first sub pixel 23 is disconnected from the column signal line CL. Moreover, at the time T3e, PRES(3) changes to high level. Therefore, the first reset element 333 of the first sub pixel 23 is turned on, and the first charge-voltage converter FD3 of the first sub pixel 23 is set in the reset state.

The noise readout operation, synthesizing readout operation, and component readout operation from the first sub pixel 23 arranged on the third row and the second sub pixel 24 arranged on the fourth row are performed as described above. Based on the noise N1 and the signal S1, the processing circuit 150 can obtain, as the image signal, the pseudo average value of the signals of the first and second sub pixels 23 and 24 (first and second photoelectric converters 331 and 341) according to equation (3).

The processing circuit 150 can also obtain the signal (SA+(NA−NB)/2) of the first photoelectric converter (PD-A) 331 as the first component signal (first AF signal) by subtracting half the noise N1 (=(NA+NB)/2) from the signal S2 (=SA+NA). The difference between the noise NA and the noise NB becomes the error of the signal obtained from the first photoelectric converter (PD-A) 331. It is possible, however, to allow the error caused by the difference between the noise NA and the noise NB because the accuracy required of the signal for focus detection is lower than the accuracy required of the image signal (the signal read out by the synthesizing signal readout operation). The processing circuit 150 can further obtain the second component signal (second AF signal) by subtracting the first component signal (first AF signal) from the image signal.

Figure 11:
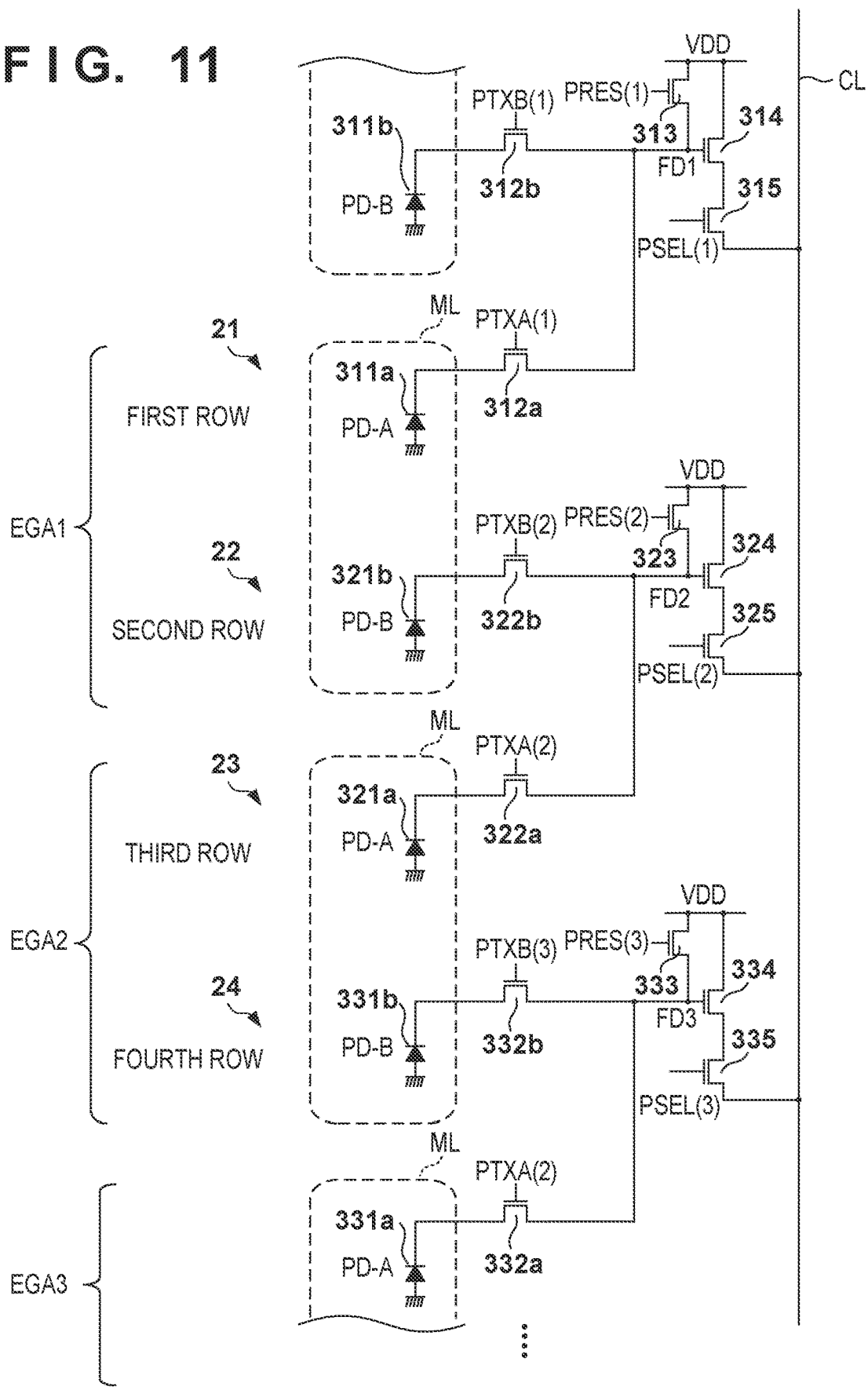
FIG. 11 is a circuit diagram showing an example of the arrangement of a pixel array in an image sensing device according to the second embodiment.

FIG. 11 shows an example of the arrangement of a pixel array 104 in an image sensing device 1 according to the second embodiment of the present invention. The image sensing device 1 of the second embodiment is different from the image sensing device 1 of the first embodiment in arrangement of the pixel array 104. However, other constituent elements can be the same as in the first embodiment. FIG. 11 shows some of the predetermined number of pixels EGA that share one column signal line CL of the pixel array 104 in the image sensing device 1 according to the second embodiment. Note that in order to distinguish the pixels EGA from each other, suffixes 1 to 3 are added to the pixels EGA like EGA1 to EGA3.

Figure 12:
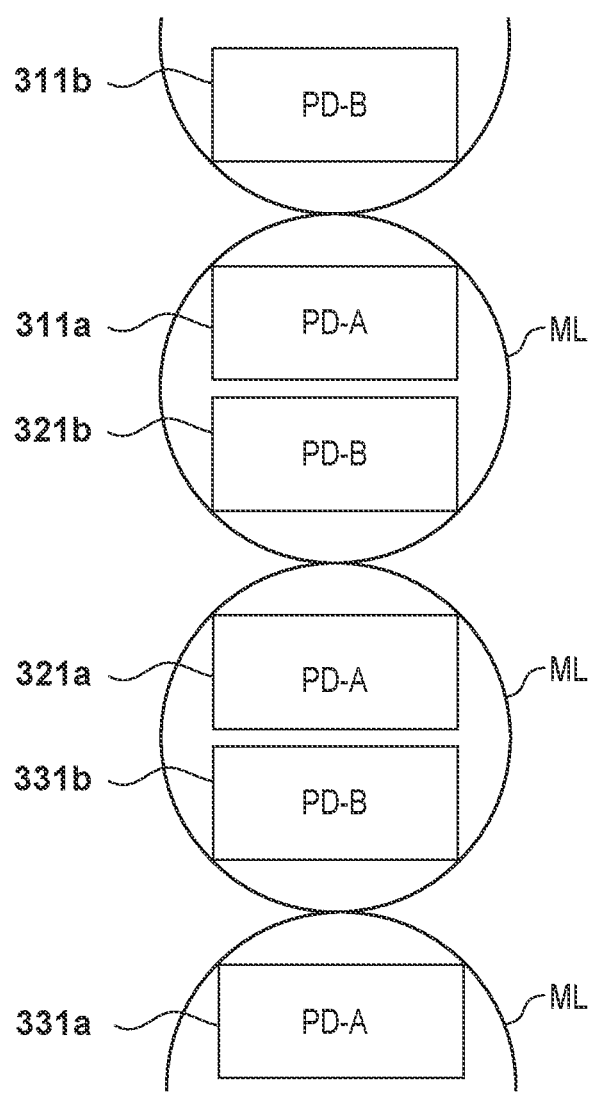
FIG. 12 is a view schematically showing the arrangement of the first and second photoelectric converters that share a microlens according to the second embodiment.

The pixel array 104 includes a plurality of first photoelectric converters (PD-A) 311a, 321a, 331a . . . and a plurality of second photoelectric converters (PD-B) 311b, 321b, 331b . . . . Each pixel EGA includes a first photoelectric converter PD-A and a second photoelectric converter PD-B that share one microlens ML. For example, the pixel EGA1 includes the first photoelectric converter (PD-A) 311a and the second photoelectric converter (PD-B) 321b that share one microlens ML. Moreover, the pixel EGA2 includes the first photoelectric converter (PD-A) 321a and the second photoelectric converter (PD-B) 331b that share one microlens ML. FIG. 12 schematically shows the arrangement of the first photoelectric converters PD-A and the second photoelectric converters PD-B that share the microlenses ML.

The second photoelectric converter (PD-B) 321b of one pixel EGA1 and the first photoelectric converter (PD-A) 321a of the other pixel EGA2 share a charge-voltage converter FD2 and a driving element 324. In the second embodiment, the second photoelectric converter (PD-B) 331b of the other pixel EGA2 and the first photoelectric converter (PD-A) 331a of still other pixel EGA3 share a charge-voltage converter FD3 and a driving element 334.

A first sub pixel 21 includes the first photoelectric converter (PD-A) 311a, and a second sub pixel 22 includes the second photoelectric converter (PD-B) 321b. A first sub pixel 23 includes the first photoelectric converter (PD-A) 321a, and a second sub pixel 24 includes the second photoelectric converter (PD-B) 331b.

The pixel array 104 includes transfer elements 312b, 312a, 322b, 322a, 332b, 332a . . . that transfer charges of photoelectric converters to charge-voltage converters corresponding to them. The pixel array 104 includes, for example, the transfer element 322b that transfers charges of the photoelectric converter (PD-B) 321b to the charge-voltage converter FD2 and the transfer element 322a that transfers charges of the photoelectric converter (PD-B) 321a to the charge-voltage converter FD3. The pixel array 104 also includes the transfer element 332b that transfers charges of the photoelectric converter (PD-B) 331b to the charge-voltage converter FD3 and the transfer element 332a that transfers charges of the photoelectric converter (PD-B) 331a to the charge-voltage converter FD3.

The pixel array 104 includes a reset element 313 that resets a charge-voltage converter FD1, a driving element 314 that outputs a signal corresponding to a potential of the charge-voltage converter FD1 to the column signal line CL, and a selection element 315 that connects the driving element 314 and the column signal line CL. The pixel array 104 also includes a reset element 323 that resets the charge-voltage converter FD2, a driving element 324 that outputs a signal corresponding to a potential of the charge-voltage converter FD2 to the column signal line CL, and a selection element 325 that connects the driving element 324 and the column signal line CL. The pixel array 104 also includes a reset element 333 that resets the charge-voltage converter FD3, a driving element 334 that outputs a signal corresponding to a potential of the charge-voltage converter FD3 to the column signal line CL, and a selection element 325 that connects the driving element 334 and the column signal line CL.

Figure 13:
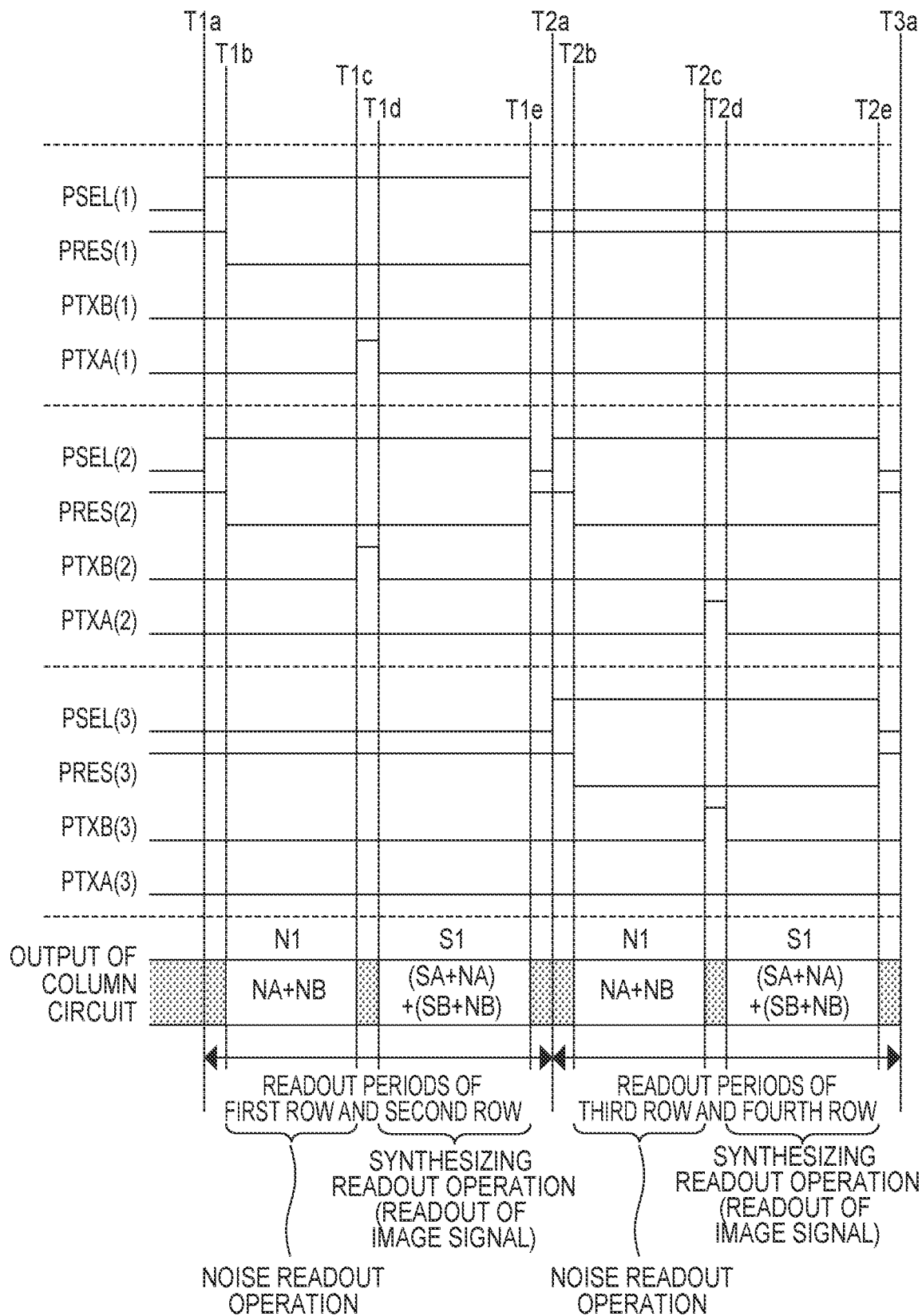
FIG. 13 is a timing chart showing the first operation example of the image sensing device according to the second embodiment.

FIG. 13 shows the first operation example of the image sensing device 1 according to the second embodiment. At time T1a, PSEL(1) and PSEL(2) change to high level. Therefore, the first selection element 315 for the first sub pixel 21 is turned on, and the first driving element 314 for the first sub pixel 21 is connected to the column signal line CL. Similarly, the second selection element 325 for the second sub pixel 22 is turned on, and the second driving element 324 for the second sub pixel 22 is connected to the column signal line CL. The driving element on a row other than these is not connected to the column signal line CL.

The noise readout operation is performed from time T1b to time T1c. At the time T1b, PRES(1) and PRES(2) change to low level. Therefore, the first reset element 313 for the first sub pixel 21 is turned off, and resetting of the first charge-voltage converter FD1 is canceled. Similarly, the second reset element 323 for the second sub pixel 22 is turned off, and resetting of the second charge-voltage converter FD2 is canceled. The charge-voltage converter FD other than these is held in a reset state.

Next, from the time T1b to the time T1c, the first charge-voltage converter FD1 for the first sub pixel 21 and the second charge-voltage converter FD2 for the second sub pixel 22 hold a state (noise) immediately after resetting. During this period, the first and second driving elements 314 and 324 for the first and second sub pixels 21 and 22 drive the column signal line CL simultaneously. Therefore, noise N1 corresponding to noises NA and NB of the first and second charge-voltage converters FD1 and FD2 appear in the column signal line CL. A column circuit CC outputs the noise N1 corresponding to the aforementioned VoN.

From the time T1c to time T1d, PTXA(1) and PTXB(2) change to high level. Therefore, the first transfer element 312a for the first sub pixel 21 is turned on, and charges of the first photoelectric converter (PD-A) 311a are transferred to the first charge-voltage converter FD1. Similarly, the second transfer element 322b for the second sub pixel 22 is turned on, and charges of the second photoelectric converter (PD-B) 321b are transferred to the second charge-voltage converter FD2.

Synthesizing readout is performed from the time T1d to time T1e. From the time T1d to the time T1e, the first charge-voltage converter FD1 for the first sub pixel 21 holds the charges and noise generated by the first photoelectric converter 311a. Moreover, from the time T1d to the time T1e, the second charge-voltage converter FD2 for the second sub pixel 22 holds the charges and noise generated by the second photoelectric converter 321b. During this period, the first driving element 314 for the first sub pixel 21 and the second driving element 324 for the second sub pixel 22 drive the column signal line CL simultaneously. Therefore, a signal S1 corresponding to a signal and noise (SA+NA) of the first sub pixel 21, and a signal and noise (SB+NB) of the second sub pixel 22 appears in the column signal line CL. The column circuit CC outputs the signal S1 corresponding to the aforementioned (VoS+VoN). Therefore, based on the noise N1 and the signal S1, a processing circuit 150 can obtain the pseudo average value of signals of the first and second sub pixels 21 and 22 (first and second photoelectric converters 311 and 321) according to equation (3).

At the time T1e, PSEL(1) and PSEL(2) change to low level. Therefore, the first selection element 315 for the first sub pixel 21 is turned off, and the first driving element 314 for the first sub pixel 21 is disconnected from the column signal line CL. In addition, the second selection element 325 for the second sub pixel 22 is turned off, and the second driving element 324 for the second sub pixel 22 is disconnected from the column signal line CL. Moreover, at the time T1e, PRES(1) and PRES(2) change to high level. Therefore, the first reset element 313 for the first sub pixel 21 is turned on, and the first charge-voltage converter FD1 for the first sub pixel 21 is set in the reset state. The second reset element 323 for the second sub pixel 22 is turned on, and the second charge-voltage converter FD2 for the second sub pixel 22 is set in the reset state.

The noise readout operation and synthesizing readout operation from the first sub pixel 21 arranged on the first row and the second sub pixel 22 arranged on the second row in the first operation example are performed as described above. Concerning the other rows, the noise readout operation and the synthesizing readout operation are performed in the same manner.

Figure 14:
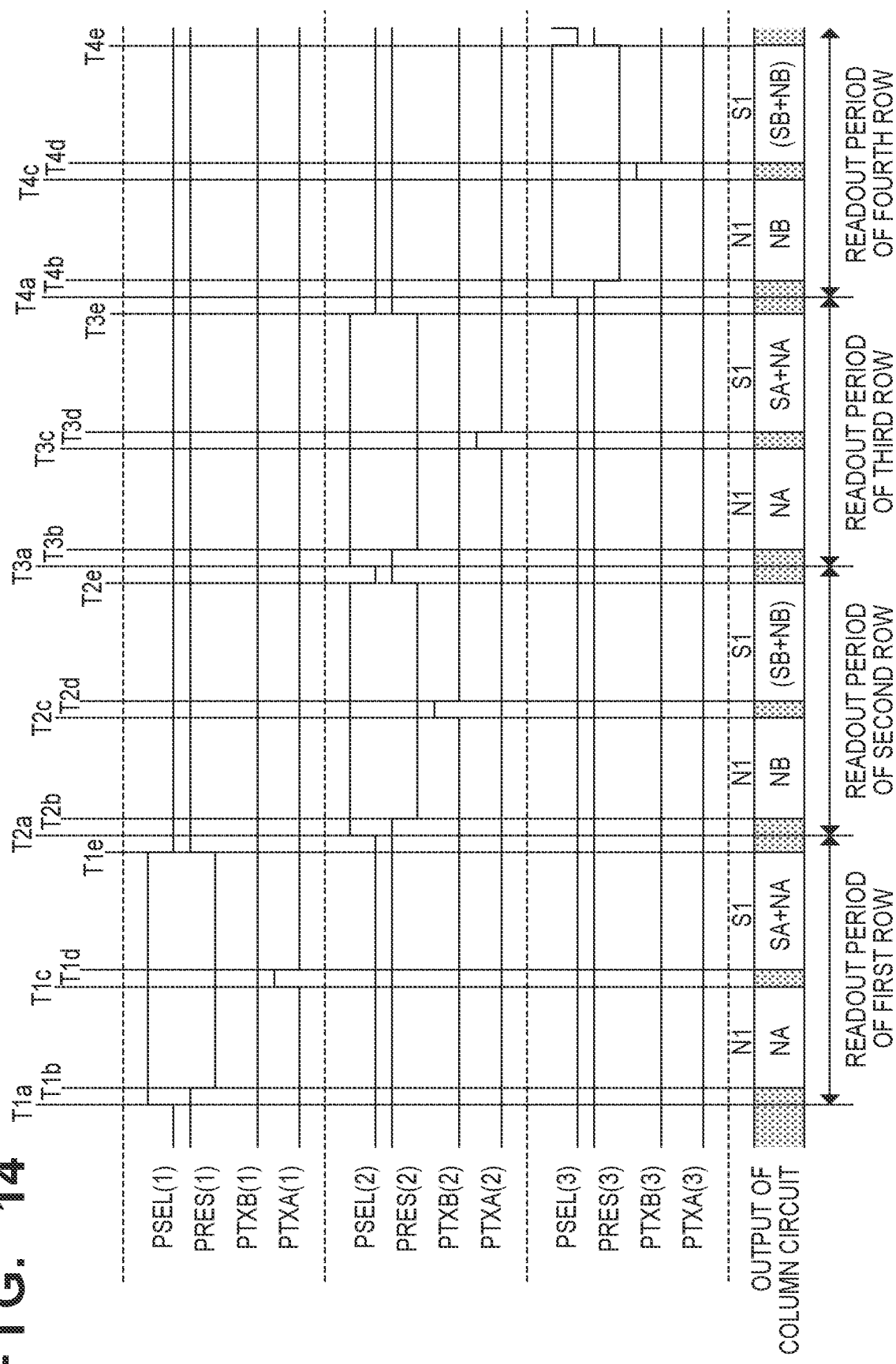
FIG. 14 is a timing chart showing the second operation example of the image sensing device according to the second embodiment.

FIG. 14 shows the second operation example of the image sensing device 1 according to the second embodiment. FIG. 14 shows a readout operation for signals from the first sub pixel 21 arranged on the first row, the second sub pixel 22 arranged on the second row, the first sub pixel 23 arranged on the third row, and the second sub pixel 24 arranged on the fourth row in the second operation example according to the second embodiment. In the second operation example, noise and a signal are output from each of the first sub pixel and the second sub pixel.

From the time T1a to time T2a, the noise N1 and the signal S1 of a first photoelectric converter (PD-A) 311 of the first sub pixel 21 serving as a sub pixel on the first row are read out. At the time T1a, PSEL(1) changes to high level. Therefore, the first selection element 315 of the first sub pixel 21 is turned on, and the first driving element 314 for the first sub pixel 21 is connected to the column signal line CL. The driving elements other than this are not connected to the column signal line CL.

Next, at the time T1b, PRES(1) changes to low level. Therefore, the first reset element 313 for the first sub pixel 21 is turned off, and resetting of the first charge-voltage converter FD1 is canceled. The first and second charge-voltage converters other than this are held in the reset state.

From the time T1b to the time T1c, the first charge-voltage converter FD1 for the first sub pixel 21 holds the state (noise) immediately after resetting. During this period, the first driving element 314 for the first sub pixel 21 drives the column signal line CL. Therefore, the noise N1 corresponding to the noise NA of the first charge-voltage converter FD1 appears in the column signal line CL. The column circuit CC outputs the noise N1.

From the time T1c to the time T1d, PTX(1) is driven to high level. Therefore, the first transfer element 312a of the first sub pixel 21 is turned on, and the charges of the first photoelectric converter (PD-A) 311a are transferred to the first charge-voltage converter FD1 for the first sub pixel 21.

From the time T1d to the time T1e, the first charge-voltage converter FD1 for the first sub pixel 21 holds the charges and noise generated by the first photoelectric converter (PD-A) 311a. During this period, the first driving element 314 for the first sub pixel 21 drives the column signal line CL. Therefore, the signal S1 corresponding to the signal and noise (SA+NA) of the first sub pixel 21 appears in the column signal line CL. The column circuit CC outputs the signal S1. Therefore, based on N1 and S1, the processing circuit 150 can obtain a signal (SA) of the first sub pixel 21.

At the time T1e, PSEL(1) changes to low level. Therefore, the first selection element 315 for the first sub pixel 21 is turned off, and the first driving element 314 for the first sub pixel 21 is disconnected from the column signal line CL. Moreover, at the time T1e, PRES(1) changes to high level. Therefore, the first reset element 313 for the first sub pixel 21 is turned on, and the first charge-voltage converter FD1 for the first sub pixel 21 is set in the reset state.

The noise and signal readout operation from the first sub pixel 21 arranged on the first row in the second operation example is performed as described above. Concerning the other rows, the noise and signal readout operation is performed in the same manner.

In a period from the time T2a to time T3a, the noise N1 and the signal S1 of the second photoelectric converter (PD-B) 321 of the second sub pixel 22 serving as a sub pixel on the second row are read out. At the time T2a, PSEL(2) changes to high level. Therefore, the second selection element 325 for the second sub pixel 22 is turned on, and the second driving element 324 for the second sub pixel 22 is connected to the column signal line CL. The driving elements other than this are not connected to the column signal line CL.

At the time T2b, PRES(2) changes to low level. Therefore, the second reset element 323 for the second sub pixel 22 is turned off, and resetting of the second charge-voltage converter FD2 is canceled. The first and second charge-voltage converters other than this are held in the reset state.

From time T2b to time T2c, the second charge-voltage converter FD2 for the second sub pixel 22 holds the state (noise) immediately after resetting. During this period, the second driving element 324 for the second sub pixel 22 drives the column signal line CL. Therefore, the noise N1 corresponding to the noise NB of the second charge-voltage converter FD2 appears in the column signal line CL. The column circuit CC outputs the noise N1.

From the time T2c to time T2d, PTXB(2) is driven to high level. Therefore, the second transfer element 322b for the second sub pixel 22 is turned on, and the charges of the second photoelectric converter (PD-B) 321b are transferred to the second charge-voltage converter FD2 for the second sub pixel 22.

From the time T2d to time T2e, the second charge-voltage converter FD2 for the second sub pixel 22 holds the charges and noise generated by the second photoelectric converter (PD-B) 321b. During this period, the second driving element 324 for the second sub pixel 22 drives the column signal line CL. Therefore, the signal S1 corresponding to the signal and noise (SB+NB) of the second sub pixel 22 appears in the column signal line CL. The column circuit CC outputs the signal S1. Therefore, based on N1 and S1, the processing circuit 150 can obtain a signal (SB) of the second sub pixel 22.

The signals of the first and second photoelectric converter 311a and 321b of the first and second sub pixels 21 and 22 that share one microlens can be read out as described above. Signals of the first and second photoelectric converters of the first and second sub pixels that share other microlens can also be read out in the same manner.

The third to sixth operation examples of the first embodiment may be applied to a readout operation for the signals from the pixel array 104 of the second embodiment.

Figure 15:
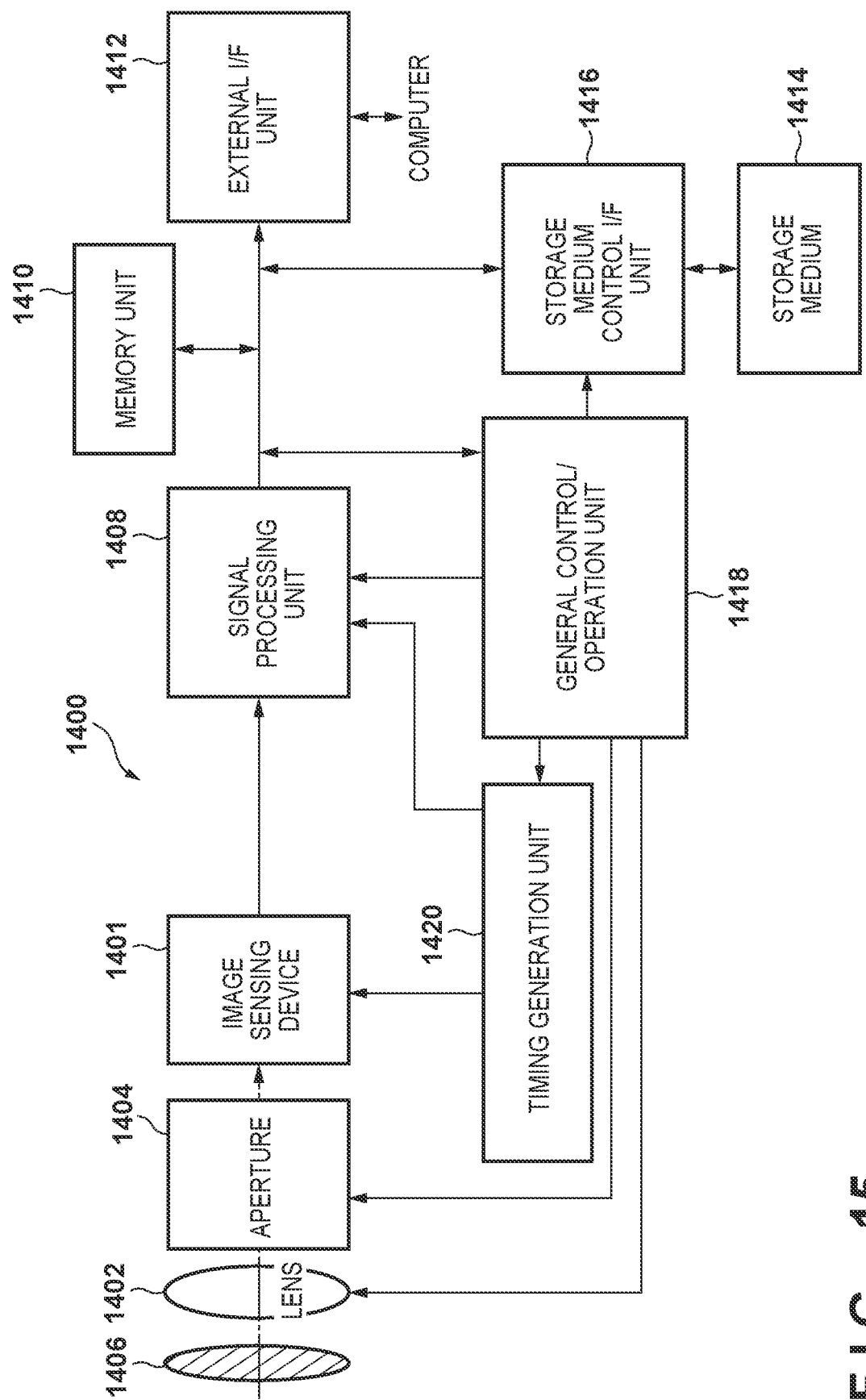
FIG. 15 is a block diagram showing an example of an image sensing system that includes an image sensing device.

In this embodiment, an example of an image sensing system that includes the image sensing device described in the first or second embodiment will be described with reference to FIG. 15. The same reference numerals as in the image sensing device according to the first or second embodiment denote the same constituent elements, and an explanation thereof will be omitted or simplified. FIG. 15 is a block diagram showing an outline of the arrangement of the image sensing system according to this embodiment.

The image sensing device 1 of the first or second embodiment is applicable to various image sensing systems. Examples of image sensing systems to which the device is applicable are a digital still camera, a digital camcorder, a surveillance camera, a copying machine, a facsimile apparatus, a cell phone, an in-vehicle camera, and an observation satellite. The image sensing systems also include a camera module including an optical system such as a lens and the solid-state image sensing device. FIG. 15 is a block diagram of a digital still camera as an example of these image sensing systems.

An image sensing system 1400 shown in FIG. 15 includes a solid-state image sensing device 1401, and a lens 1402 for forming an optical image of an object on the solid-state image sensing device 1401. The image sensing system 1400 also includes an aperture 1404 for varying the amount of light passing through the lens 1402, and a barrier 1406 for protecting the lens 1402. The lens 1402 and the aperture 1404 form an optical system for concentrating light to the solid-state image sensing device 1401. The solid-state image sensing device 1401 is the solid-state image sensing device 1 explained in the first or second embodiment, and converts the optical image formed by the lens 1402 into image data.

The image sensing system 1400 also includes a signal processing unit 1408 for processing an output signal from the solid-state image sensing device 1401. The signal processing unit 1408 performs A/D conversion which converts an analog signal output from the solid-state image sensing device 1401 into a digital signal. In addition, the signal processing unit 1408 performs an operation of performing various kinds of correction and compression as needed, and outputting the image data. An A/D converter as a part of the signal processing unit 1408 can be formed on a semiconductor substrate on which the solid-state image sensing device 1401 is formed, and can also be formed on a semiconductor substrate different from the solid-state image sensing device 1401. Furthermore, the solid-state image sensing device 1401 and the signal processing unit 1408 can be formed on the same semiconductor substrate.

The image sensing system 1400 further includes a memory unit 1410 for temporarily storing image data, and an external interface unit (external I/F unit) 1412 for communicating with an external computer or the like. In addition, the image sensing system 1400 includes a storage medium 1414 such as a semiconductor memory for storing or reading out image sensing data, and a storage medium control interface unit (storage medium control I/F unit) 1416 for storing or reading out data in or from the storage medium 1414. Note that the storage medium 1414 can be incorporated into the image sensing system 1400, and can also be detachable.

Furthermore, the image sensing system 1400 includes a general control/operation unit 1418 for controlling various kinds of arithmetic processing and the whole digital still camera, and a timing generation unit 1420 for outputting various timing signals to the solid-state image sensing device 1401 and the signal processing unit 1408. Note that the timing signals may also be externally input, and the image sensing system 1400 need only include at least the solid-state image sensing device 1401, and the signal processing unit 1408 for processing output signals from the solid-state image sensing device 1401.

The solid-state image sensing device 1401 outputs an image sensing signal to the signal processing unit 1408. The signal processing unit 1408 performs predetermined signal processing on the image sensing signal output from the solid-state image sensing device 1401 and outputs image data. The signal processing unit 1408 performs image formation by using the image sensing signal. For example, the signal processing unit 1408 performs focus detection by using a noise signal, and a digital signal based on the first pixel signal and the second pixel signal of the solid-state image sensing device 1401. Additionally, the signal processing unit 1408 performs image formation by using the noise signal and a digital signal based on the second or fourth pixel signal of the solid-state image sensing device 1401.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-174245, filed Sep. 11, 2017, which is hereby incorporated by reference herein in its entirety.

What is claimed is:

1. An image sensing device comprising:
   a pixel array in which a plurality of pixels are arranged in a matrix, and each pixel includes first and second photoelectric converters that share a microlens;
   a plurality of column signal lines each connected to pixels arranged in a corresponding column out of the plurality of pixels; and
   a readout circuit including a plurality of column circuits each configured to receive a signal of a corresponding column signal line out of the plurality of column signal lines,
   wherein each of the plurality of pixels includes first and second driving elements respectively configured to output signals corresponding to charges respectively generated by the first and second photoelectric converters to a corresponding column signal line out of the plurality of column signal lines, and
   in a state in which signals are output from both the first and second driving elements included in a selected pixel to a column signal line corresponding to each of the plurality of column circuits, the readout circuit reads out a signal of the column signal line corresponding to the column circuit.

2. The device according to claim 1, wherein the pixel array further includes first and second reset elements respectively configured to perform reset operations of resetting inputs of the first and second driving elements for each pixel, and first and second transfer elements respectively configured to perform transfer operations of transferring the charges respectively generated by the first and second photoelectric converters of each pixel to the inputs of the first and second driving elements, respectively,
   the readout circuit performs a synthesizing readout operation that is an operation in which each of the plurality of column circuits reads out a signal of a column signal line corresponding to the column circuit in the state after the transfer operations by the first and second transfer elements,
   the readout circuit performs a noise readout operation after the reset operations by the first and second reset elements, and before the transfer operations, and
   in the noise readout operation, in a state in which noises are output from both the first and second driving elements included in the selected pixel to the column signal line corresponding to the column circuit, the readout circuit reads out a noise of the column signal line corresponding to the column circuit.

3. The device according to claim 2, wherein after the synthesizing readout operation, the second reset element performs the reset operation of resetting the input of the second driving element,
   the readout circuit performs a component readout operation after the synthesizing readout operation and the reset operation by the second reset element, and
   in the component readout operation, in a state in which signals are output from both the first and second driving elements which are included in the pixel connected to the column signal line corresponding to each of the plurality of column circuits to the column signal line corresponding to the column circuit, the readout circuit reads out a signal of the column signal line corresponding to the column circuit.

4. The device according to claim 3, wherein for a pixel of a first type out of the plurality of pixels, the synthesizing readout operation and the component readout operation are performed, and
   for a pixel of a second type out of the plurality of pixels, the synthesizing readout operation is performed, but the component readout operation is not performed.

5. The device according to claim 4, wherein a time from an end of the reset operation immediately before the synthesizing readout operation to the synthesizing readout operation and a time from the end of the reset operation immediately before the component readout operation for the pixel of the first type to the component readout operation for the pixel of the first type are equal to each other.

6. The device according to claim 2, wherein the readout circuit performs a component readout operation after the synthesizing readout operation, and
   in the component readout operation, in a state in which the first driving element drives the column signal line, and the second driving element does not drive the column signal line, each column circuit reads out a signal of the column signal line.

7. The device according to claim 6, wherein for a pixel of a first type out of the plurality of pixels, the synthesizing readout operation and the component readout operation are performed, and
   for a pixel of a second type out of the plurality of pixels, the synthesizing readout operation is performed, but the component readout operation is not performed.

8. The device according to claim 7, wherein a time from an end of the reset operation immediately before the synthesizing readout operation to the synthesizing readout operation and a time from the end of the reset operation immediately before the component readout operation for the pixel of the first type to the component readout operation for the pixel of the first type are equal to each other.

9. The device according to claim 1, wherein the second photoelectric converter of one pixel and the first photoelectric converter of another pixel share one first driving element, and the second photoelectric converter of the other pixel and the first photoelectric converter of still another pixel share the other first driving element.

10. The device according to claim 9, wherein the pixel array further includes a first selection element arranged between the first driving element and the column signal line, and a second selection element arranged between the second driving element and the column signal line.

11. The device according to claim 1, wherein each of the plurality of pixels further includes a first selection element arranged between the first driving element and the column signal line, and a second selection element arranged between the second driving element and the column signal line, and
   both the first selection element and the second selection element included in the selected pixel are turned on, thereby generating the state.

12. The device according to claim 1, wherein each of the plurality of pixels further includes a first selection element arranged between the first driving element and the column signal line, and a second selection element arranged between the second driving element and the column signal line,
   in a first period, both the first selection element and the second selection element included in the selected pixel are turned on, thereby generating the state, and
   in a second period different from the first period, one of the first selection element and the second selection element included in the selected pixel is turned on.

13. The device according to claim 3, further comprising a processing circuit configured to perform, based on a signal read out in the synthesizing readout operation by the readout circuit and a signal read out in the component readout operation by the readout circuit, an arithmetic operation for focusing.

14. An image sensing system comprising:
    an image sensing device defined in claim 1; and
    a signal processing unit configured to process a signal output from the image sensing device.

* * * * *